US011043045B2

(12) United States Patent
Matsuura et al.

(10) Patent No.: US 11,043,045 B2
(45) Date of Patent: Jun. 22, 2021

(54) MONITORING DEVICE AND MOTOR VEHICLE INCLUDING THE SAME

(71) Applicant: Rohm Co., Ltd., Kyoto (JP)

(72) Inventors: Takayuki Matsuura, Kyoto (JP); Shinji Kawata, Kyoto (JP); Yoshiyuki Nakatani, Kyoto (JP); Yuichi Kokusho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 172 days.

(21) Appl. No.: 16/170,148

(22) Filed: Oct. 25, 2018

(65) Prior Publication Data

US 2019/0130666 A1 May 2, 2019

(30) Foreign Application Priority Data

Oct. 27, 2017 (JP) .............................. JP2017-208246

(51) Int. Cl.
| | |
|---|---|
| *G07C 5/08* | (2006.01) |
| *H03K 21/02* | (2006.01) |
| *H03K 5/24* | (2006.01) |
| *G01R 31/3187* | (2006.01) |
| *G06F 11/22* | (2006.01) |
| *H03K 19/007* | (2006.01) |

(52) U.S. Cl.
CPC ............ *G07C 5/08* (2013.01); *G01R 31/3187* (2013.01); *G06F 11/22* (2013.01); *H03K 5/24* (2013.01); *H03K 19/007* (2013.01); *H03K 21/02* (2013.01)

(58) Field of Classification Search
CPC ........ G07C 5/08; G01R 31/3187; G06F 11/22; G06F 11/27; H03K 19/007; H03K 21/02; H03K 5/24
USPC ........................................................ 701/33.9
See application file for complete search history.

(56) References Cited

U.S. PATENT DOCUMENTS

2014/0350791 A1* 11/2014 Matsushita .......... B62D 5/0481
701/41

FOREIGN PATENT DOCUMENTS

WO 2013/084277 6/2013

* cited by examiner

*Primary Examiner* — Maceeh Anwari
(74) *Attorney, Agent, or Firm* — Fish & Richardson P.C.

(57) ABSTRACT

A monitoring device includes a monitoring part configured to detect an abnormality of a monitoring target, a self-diagnosis part configured to diagnose whether or not the monitoring part operates normally during a period from a startup time point of a power supply to an elapse time point at which a reset release waiting time elapses, and a reset control part configured to release a reset of a reset output signal on or after the elapse time point.

9 Claims, 25 Drawing Sheets

FIG. 14

FIG. 15
| NAME | D7 | D6 | D5 | D4 | D3 | D2 | D1 | D0 |
|---|---|---|---|---|---|---|---|---|
| ERR_BCHECK1 | DIN4 UVD | DIN3 UVD | DIN2 UVD | DIN1 UVD | DIN4 OVD | DIN3 OVD | DIN2 OVD | DIN1 OVD |
| ERR_BCHECK2 | - | - | - | - | VRDET2 | VRDET1 | RST UVD | RST OVD |
FIG. 16
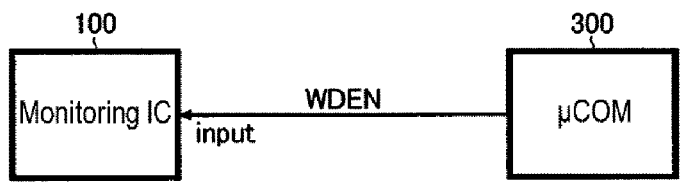
FIG. 17
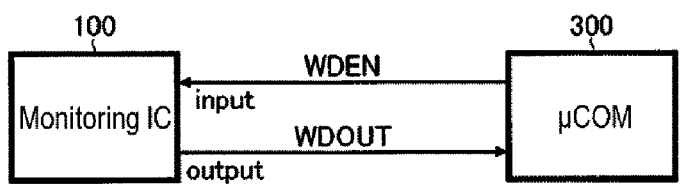

FIG. 19

| WDEN (μCON) | WDOUT | CONDITION |
|---|---|---|
| H | H | OK |
| L | L | OK |
| H | L | NG (GND short) |
| L | H | NG (VDD short) |

MONITORING DEVICE AND MOTOR VEHICLE INCLUDING THE SAME

CROSS-REFERENCE TO RELATED APPLICATION

This application is based upon and claims the benefit of priority from Japanese Patent Application No. 2017-208246, filed on Oct. 27, 2017, the entire contents of which are incorporated herein by reference.

TECHNICAL FIELD

The present disclosure relates to a monitoring device, and a motor vehicle including the monitoring device.

BACKGROUND

Conventionally, monitoring devices (e.g., monitoring ICs) for monitoring various voltages and clock signals to detect abnormality thereof are used in various applications.

However, in the aforementioned conventional monitoring device, there is still room for further improvement in increasing a failure detection rate.

In recent years, it is required for in-vehicle ICs to comply with ISO 26262 (international standard for the functional safety related to the electric/electronic of a motor vehicle). Even in in-vehicle monitoring ICs, reliability design considering a fail-safe mechanism is required.

SUMMARY

The present disclosure provides some embodiments of a monitoring device having a high failure detection rate.

According to one embodiment of the present disclosure, there is provided a monitoring device, including: a monitoring part configured to detect an abnormality of a monitoring target; a self-diagnosis part configured to diagnose whether or not the monitoring part operates normally during a period from a startup time point of a power supply to an elapse time point at which a reset release waiting time elapses; and a reset control part configured to release a reset of a reset output signal on or after the elapse time point (first configuration).

In the device of the first configuration, the self-diagnosis part is further configured to repeatedly diagnose the monitoring part until the self-diagnosis part determines that the monitoring part operates normally (second configuration).

In the device of the first configuration, while sequentially switching a diagnosis target, to which a test signal is inputted, from among a plurality of monitoring mechanisms included in the monitoring part, the self-diagnosis part is further configured to determine whether or not an output signal from a monitoring mechanism serving as the diagnosis target matches a first expected value and also to determine whether or not an output signal from each of the plurality of monitoring mechanisms other than the monitoring mechanism serving as the diagnosis target matches a second expected value (third configuration).

In the device of the first configuration, the monitoring part includes an upper comparator configured to detect whether or not an input signal is higher than an upper threshold value; and a lower comparator configured to detect whether the input signal is lower than a lower threshold value, and the self-diagnosis part is further configured to determine whether or not an output signal of each of the upper comparator and the lower comparator matches an expected value, while sequentially switching the input signal among a first test signal higher than the upper threshold value, a second test signal lower than the upper threshold value and higher than the lower threshold value, and a third test signal lower than the lower threshold value (fourth configuration).

In the device of the first configuration, the self-diagnosis part is further configured to store an error flag for indicating an object in which an error occurs (fifth configuration).

According to another embodiment of the present disclosure, there is provided a monitoring device, including: a monitoring part configured to detect an abnormality of a monitoring target; an input terminal to which an enable signal for switching between validity and invalidity of the monitoring part is inputted; and an output terminal configured to output a status signal for notifying validity or invalidity of the monitoring part (sixth configuration).

In the device of the sixth configuration, the monitoring part includes a watchdog timer configured to detect a frequency abnormality of a monitoring target signal (seventh configuration).

According to a further embodiment of the present disclosure, there is provided a monitoring device, including: a first oscillator configured to generate a first clock signal having a first oscillation frequency; a second oscillator configured to generate a second clock signal having a second oscillation frequency lower than the first oscillation frequency; a frequency divider configured to divide the first oscillation frequency of the first clock signal to generate a third clock signal having a third oscillation frequency lower than the second oscillation frequency; a first low frequency abnormality detection part configured to detect a low frequency abnormality of the third clock signal using the second clock signal; and a second low frequency abnormality detection part configured to detect a low frequency abnormality of the second clock signal using the first clock signal (eighth configuration).

In the device of the eighth configuration, the first clock signal is a clock signal for digital processing, and the second clock signal is a clock signal for a watchdog timer (ninth configuration).

The device of the ninth configuration further includes: a reset control part configured to latch a plurality of abnormality signals and output an output signal in synchronization with the first clock signal; and a logic gate configured to set a reset output signal to a logic level indicated at the time of abnormality detection by ignoring the output signal of the reset control part when an abnormal stop of the first clock signal is detected (tenth configuration).

According to a still further embodiment of the present disclosure, there is provided an electronic device including the monitoring device of the first configuration (eleventh configuration).

According to a yet still further embodiment of the present disclosure, there is provided a motor vehicle including the electronic device of the eleventh configuration (twelfth configuration).

BRIEF DESCRIPTION OF DRAWINGS

FIG. 14 is a timing chart showing an operation of generating a BIST error signal.

FIG. 15 is a register map showing a storage area of a BIST error flag.

FIG. 16 is a diagram showing how one-way communication is performed between a monitoring IC and a microcomputer.

FIG. 17 is a diagram showing how bidirectional communication is performed between the monitoring IC and the microcomputer.

FIG. 19 is a correlation diagram of an enable signal, a status signal and a terminal state.

DETAILED DESCRIPTION

One embodiment of the present disclosure will now be described in detail with reference to the drawings.

<Electronic Device>

Figure 1:
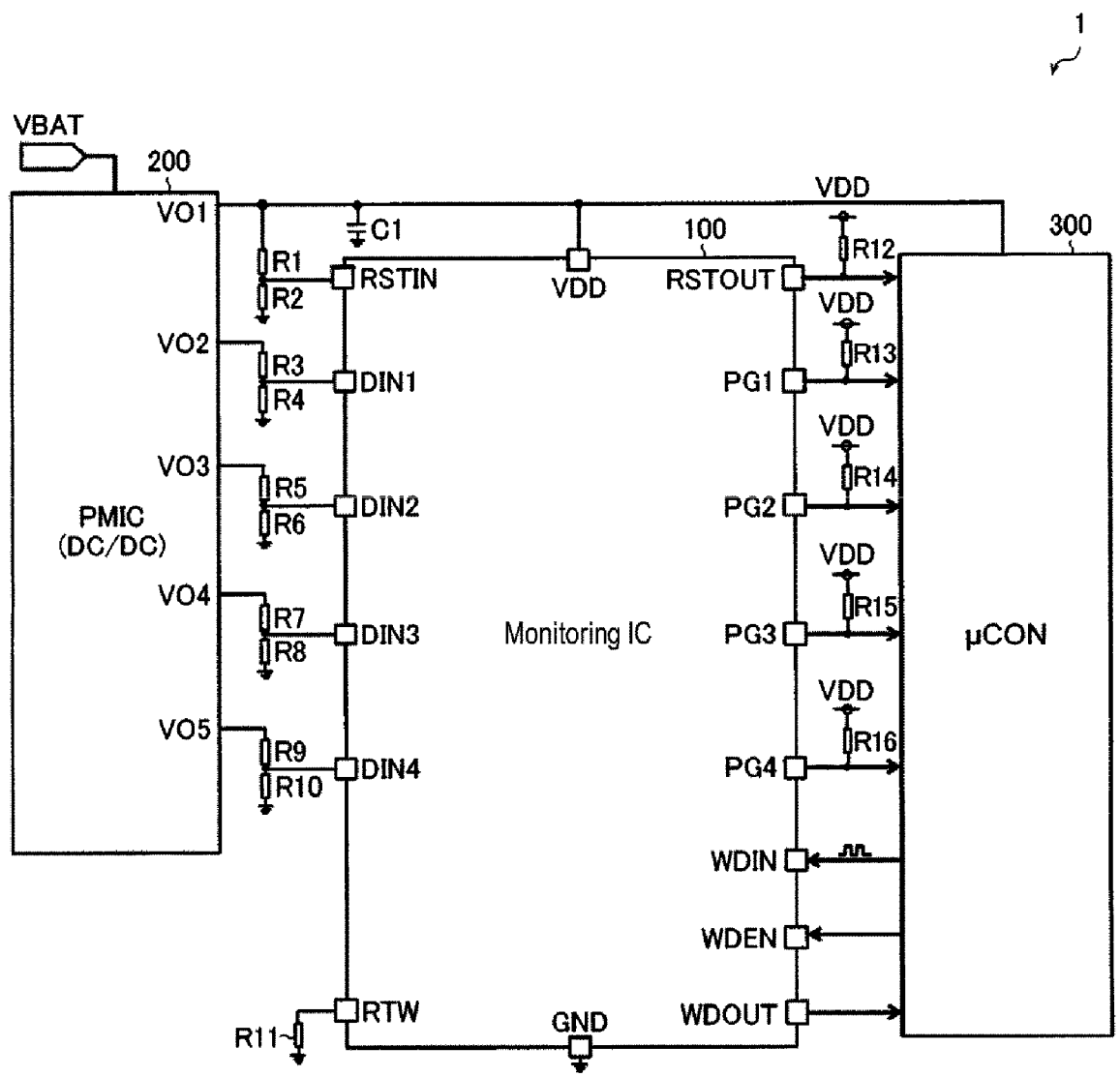
FIG. 1 is a block diagram showing an overall configuration of an electronic device.

FIG. 1 is a block diagram showing an overall configuration of an electronic device. The electronic device 1 of the present configuration example includes a monitoring IC 100, a power management IC 200 and a microcomputer 300. The electronic device 1 further includes resistors R1 to R16 and a capacitor C1 as discrete components externally attached to the aforementioned semiconductor devices such as the monitoring IC 100, the power management IC 200, and/or the microcomputer 300.

The monitoring IC 100 is a semiconductor integrated circuit device that operates by receiving a power supply voltage VDD (i.e., output voltage VO1) from the power management IC 200. The monitoring IC 100 monitors various output voltages of the power management IC 200 and the output frequency of the microcomputer 300 to detect abnormality thereof. The monitoring IC 100 includes a plurality of external terminals (a VDD pin, a GND pin, an RSTIN pin, an RSTOUT pin, DIN1 to DIN4 pins, PG1 to PG4 pins, a RTW pin, a WDIN pin, a WDEN pin and a WDOUT pin) as a means for establishing electrical connection with the outside of the IC.

The power management IC 200 is a semiconductor integrated circuit device that operates by receiving a battery voltage VBAT. The power management IC 200 generates a plurality of output voltages VO1 to VO5 and supplies them to each part of the electronic device 1. Instead of the power management IC 200, it is also possible to use a discrete DC/DC converter, an LDO (Low Drop-Out) regulator, or the like.

The microcomputer 300 is a semiconductor integrated circuit device that operates by receiving a power supply voltage VDD (i.e., output voltage VO1) from the power management IC 200. The microcomputer 300 comprehensively controls the operation of the entire electronic device 1 including the monitoring IC 100 and the power management IC 200.

The microcomputer 300 is reset by a reset output signal RSTOUT inputted from the monitoring IC 100. More specifically, the microcomputer 300 comes into a reset state (i.e., disable state) when the reset output signal RSTOUT is at a low level, and comes into a reset release state (i.e., enable state) when the reset output signal RSTOUT is at a high level.

Further, the microcomputer 300 has a function of determining whether or not the output voltage VOx of the power management IC 200 is normal according to the logic level of a power good signal PGx (where x=1, 2, 3, 4, which may apply in the following description) inputted from the monitoring IC 100. More specifically, the microcomputer 300 determines that the output voltage VOx is normal when the power good signal PGx is at the high level, and determines that the output voltage VOx is abnormal (for example, an overvoltage abnormality or a low voltage abnormality) when the power good signal PGx is at the low level.

Moreover, the microcomputer 300 has a function of outputting a watchdog input signal WDIN (a reset pulse signal of several tens Hz) and a watchdog enable signal WDEN to the WDIN pin and the WDEN pin of the monitoring IC 100, respectively. Furthermore, the microcomputer 300 also has a function of determining a match between the logic level of the watchdog enable signal WDEN set by the microcomputer 300 and the logic level of the watchdog output signal WDOUT returned from the WDOUT pin of the monitoring IC 100. These functions will be described later in detail.

The resistors R1 and R2 are connected in series between the output terminal of the output voltage VO1 and the ground terminal, and serve as a voltage dividing circuit for the output voltage VO1. The connection node (i.e., the output terminal of the voltage dividing circuit) between the resistors R1 and R2 is connected to the RSTIN pin of the monitoring IC 100.

The resistors R3 and R4 are connected in series between the output terminal of the output voltage VO2 and the ground terminal, and serve as a voltage dividing circuit for the output voltage VO2. The connection node (i.e., the output terminal of the voltage dividing circuit) between the resistors R3 and R4 is connected to the DIN1 pin of the monitoring IC 100.

The resistors R5 and R6 are connected in series between the output terminal of the output voltage VO3 and the ground terminal, and serve as a voltage dividing circuit for the output voltage VO3. The connection node (i.e., the output terminal of the voltage dividing circuit) between the resistors R5 and R6 is connected to the DIN2 pin of the monitoring IC 100.

The resistors R7 and R8 are connected in series between the output terminal of the output voltage VO4 and the ground terminal, and serve as a voltage dividing circuit for the output voltage VO4. The connection node (i.e., the output terminal of the voltage dividing circuit) between the resistors R7 and R8 is connected to the DIN3 pin of the monitoring IC 100.

The resistors R9 and R10 are connected in series between the output terminal of the output voltage VO5 and the ground terminal, and serve as a voltage dividing circuit for the output voltage VO5. The connection node (i.e., the output terminal of the voltage dividing circuit) between the resistors R9 and R10 is connected to the DIN4 pin of the monitoring IC 100.

The resistor R11 is connected between the RTW pin of the monitoring IC 100 and the ground terminal, and serves as an oscillation frequency setting element for an oscillator.

The resistor R12 is connected between the RSTOUT pin and the power supply terminal of the monitoring IC 100, and serves as a pull-up resistor for lifting the reset output signal RSTOUT, which is sent from the monitoring IC 100 to the microcomputer 300, to the power supply voltage VDD.

The resistor R13 is connected between the PG1 pin of the monitoring IC 100 and the power supply terminal, and serves as a pull-up resistor for lifting the power good signal PG1, which is sent from the monitoring IC 100 to the microcomputer 300, to the power supply voltage VDD.

The resistor R14 is connected between the PG2 pin of the monitoring IC 100 and the power supply terminal, and serves as a pull-up resistor for lifting the power good signal PG2, which is sent from the monitoring IC 100 to the microcomputer 300, to the power supply voltage VDD.

The resistor R15 is connected between the PG3 pin of the monitoring IC 100 and the power supply terminal, and serves as a pull-up resistor for lifting the power good signal PG3, which is sent from the monitoring IC 100 to the microcomputer 300, to the power supply voltage VDD.

The resistor R16 is connected between the PG4 pin of the monitoring IC 100 and the power supply terminal, and serves as a pull-up resistor for lifting the power good signal PG4, which is sent from the monitoring IC 100 to the microcomputer 300, to the power supply voltage VDD.

The capacitor C1 is connected between the output terminal of the output voltage VO1 and the ground terminal, and serves as a smoothing means of the output voltage VO1 (i.e., power supply voltage VDD).

<Monitoring IC>

Figure 2:
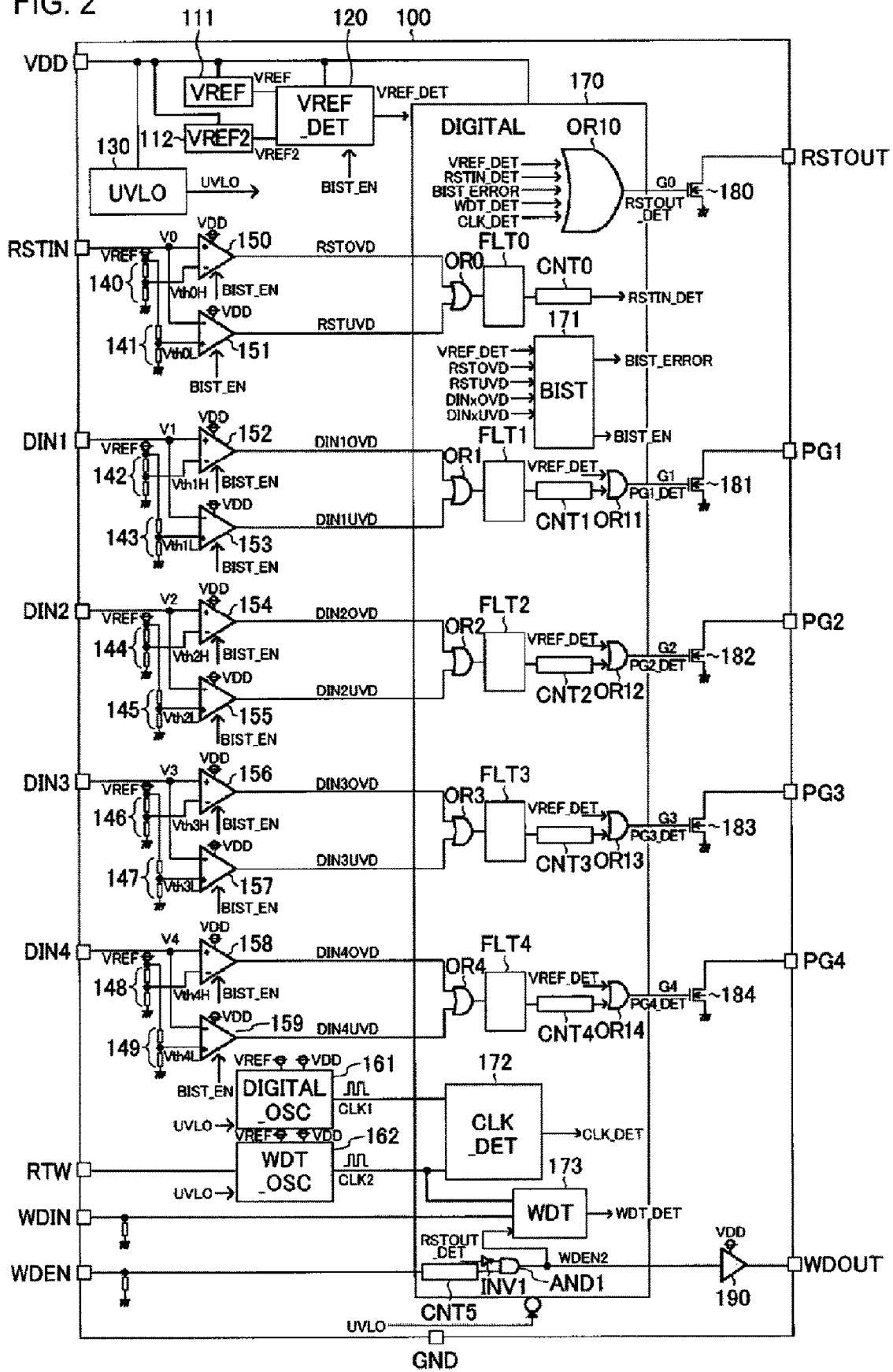
FIG. 2 is a block diagram showing an internal configuration of a monitoring IC.

FIG. 2 is a block diagram showing the internal configuration of the monitoring IC 100. The monitoring IC 100 of this configuration example includes a reference voltage generation part 111, a sub-reference voltage generation part 112, a reference voltage detection part 120, a UVLO [Under Voltage Locked-Out] part 130, threshold voltage generation parts 140 to 149, comparators 150 to 159, oscillators 161 and 162, a digital processing part 170, N channel type MOS [Metal Oxide Semiconductor] field effect transistors 180 to 184, and a buffer 190, which are integrated.

The reference voltage generation part 111 generates a predetermined reference voltage VREF from the power supply voltage VDD inputted to the VDD pin.

The sub-reference voltage generation part 112 generates a predetermined sub reference voltage VREF2 from the power supply voltage VDD.

The reference voltage detection part 120 operates by receiving the power supply voltage VDD, and generates a reference voltage detection signal VREF_DET by detecting whether the reference voltage VREF and the sub reference voltage VREF2 are normally rising. The reference voltage detection signal VREF_DET has a low level when both the reference voltage VREF and the sub reference voltage VREF2 are normally rising, and has a high level when at least one of the reference voltage VREF and the sub reference voltage VREF2 does not normally rise. In addition, a BIST [Built-In Self-Test] enable signal BIST_EN is inputted to the reference voltage detection part 120. That is, the reference voltage detection part 120 corresponds to a monitoring part (or one of a plurality of monitoring mechanisms included in the monitoring part) to be self-diagnosed at the time of startup of the monitoring IC 100.

The UVLO part 130 detects a low voltage abnormality of the power supply voltage VDD and outputs a low voltage abnormality signal UVLO. The low voltage abnormality signal UVLO becomes high level when the power supply voltage VDD is higher than a low voltage abnormality release value UVLO_OFF, and becomes low level when the power supply voltage VDD is lower than a low voltage abnormality detection value UVLO_ON.

Each of the threshold voltage generation parts 140 and 141 divides the reference voltage VREF to generate an upper threshold voltage Vth0H (for example, 0.88 V) and a lower threshold voltage Vth0L (for example, 0.72 V).

Each of the threshold voltage generation parts 142 and 143 divides the reference voltage VREF to generate an upper threshold voltage Vth1H (for example, 0.88 V) and a lower threshold voltage Vth1L (for example, 0.72 V).

Each of the threshold voltage generation parts 144 and 145 divides the reference voltage VREF to generate an upper threshold voltage Vth2H (for example, 0.88 V) and a lower threshold voltage Vth2L (for example, 0.72 V).

Each of the threshold voltage generation parts 146 and 147 divides the reference voltage VREF to generate an upper threshold voltage Vth3H (for example, 0.88 V) and a lower threshold voltage Vth3L (for example, 0.72 V).

Each of the threshold voltage generation parts 148 and 149 divides the reference voltage VREF to generate an upper threshold voltage Vth4H (for example, 0.88 V) and a lower threshold voltage Vth4L (for example, 0.72 V).

The comparator 150 operates by receiving the power supply voltage VDD and generates a comparison signal RSTOVD by comparing the input voltage V0 inputted to a non-inverting input terminal (+) from the RSTIN pin and the upper threshold voltage Vth0H inputted to an inverting input terminal (−) from the threshold voltage generation part 140. The comparison signal RSTOVD becomes a high level when V0>Vth0H, and becomes a low level when V0<Vth0H.

The comparator 151 operates by receiving the power supply voltage VDD and generates a comparison signal RSTUVD by comparing the input voltage V0 inputted to an inverting input terminal (−) from the RSTIN pin and the lower threshold voltage Vth0L inputted to a non-inverting input terminal (+) from the threshold voltage generation part 141. The comparison signal RSTUVD becomes a low level when V0>Vth0L, and becomes a high level when V0<Vth0L.

The comparator 152 operates by receiving the power supply voltage VDD and generates a comparison signal DIN1OVD by comparing the input voltage V1 inputted to a non-inverting input terminal (+) from the DIN1 pin and the upper threshold voltage Vth1H inputted to an inverting input terminal (−) from the threshold voltage generation part 142. The comparison signal DIN1OVD becomes a high level when V1>Vth1H, and becomes a low level when V1<Vth1H.

The comparator 153 operates by receiving the power supply voltage VDD and generates a comparison signal DIN1UVD by comparing the input voltage V1 inputted to an inverting input terminal (−) from the DIN1 pin and the lower threshold voltage Vth1L inputted to a non-inverting input terminal (+) from the threshold voltage generation part 143. The comparison signal DIN1UVD becomes a low level when V1>Vth1L, and becomes a high level when V1<Vth1L.

The comparator 154 operates by receiving the power supply voltage VDD and generates a comparison signal DIN2OVD by comparing the input voltage V2 inputted to a non-inverting input terminal (+) from the DIN2 pin and the upper threshold voltage Vth2H inputted to an inverting input terminal (−) from the threshold voltage generation part 144. The comparison signal DIN2OVD becomes a high level when V2>Vth2H, and becomes a low level when V2<Vth2H.

The comparator 155 operates by receiving the power supply voltage VDD and generates a comparison signal DIN2UVD by comparing the input voltage V2 inputted to an inverting input terminal (−) from the DIN2 pin and the lower threshold voltage Vth2L inputted to a non-inverting input terminal (+) from the threshold voltage generation part 145. The comparison signal DIN2UVD becomes a low level when V2>Vth2L, and becomes a high level when V2<Vth2L.

The comparator 156 operates by receiving the power supply voltage VDD and generates a comparison signal DIN3OVD by comparing the input voltage V3 inputted to a non-inverting input terminal (+) from the DIN3 pin and the upper threshold voltage Vth3H inputted to an inverting input terminal (−) from the threshold voltage generation part 146. The comparison signal DIN3OVD becomes a high level when V3>Vth3H, and becomes a low level when V3<Vth3H.

The comparator 157 operates by receiving the power supply voltage VDD and generates a comparison signal DIN3UVD by comparing the input voltage V3 inputted to an inverting input terminal (−) from the DIN3 pin and the lower threshold voltage Vth3L inputted to a non-inverting input terminal (+) from the threshold voltage generation part 147. The comparison signal DIN3UVD becomes a low level when V3>Vth3L, and becomes a high level when V3<Vth3L.

The comparator 158 operates by receiving the power supply voltage VDD and generates a comparison signal DIN4OVD by comparing the input voltage V4 inputted to a non-inverting input terminal (+) from the DIN4 pin and the upper threshold voltage Vth4H inputted to an inverting input terminal (−) from the threshold voltage generation part 148. The comparison signal DIN4OVD becomes a high level when V4>Vth4H, and becomes a low level when V4<Vth4H.

The comparator 159 operates by receiving the power supply voltage VDD and generates a comparison signal DIN4UVD by comparing the input voltage V4 inputted to an inverting input terminal (−) from the DIN4 pin and the lower threshold voltage Vth4L inputted to a non-inverting input terminal (+) from the threshold voltage generation part 149. The comparison signal DIN4UVD becomes a low level when V4>Vth4L, and becomes a high level when V4<Vth4L.

The BIST enable signal BIST_EN is inputted to each of the comparators 151 to 159. That is, each of the comparators 151 to 159 corresponds to a monitoring part (or one of a plurality of monitoring mechanisms included in the monitoring part) which becomes a self-diagnosis target at the startup time of the monitoring IC 100.

The oscillator 161 operates by receiving the power supply voltage VDD and the reference voltage VREF, and generates a clock signal CLK1 having an oscillation frequency f1 (for example, f1=2.2 MHz) used in the digital processing part 170.

The oscillator 162 operates by receiving the power supply voltage VDD and the reference voltage VREF, and generates a clock signal CLK2 having an oscillation frequency f2 (for example, f2=500 kHz) used in the digital processing part 170 (particularly the watchdog timer 173). The oscillation frequency f2 of the clock signal CLK2 can be arbitrarily adjusted by the resistor R11 (see FIG. 1) externally attached to the RTW pin.

Each of the oscillators 161 and 162 is reset by the low voltage abnormality signal UVLO. More specifically, each of the oscillators 161 and 162 comes into a reset state (i.e., disable state) when the low voltage abnormality signal UVLO is at a low level, and comes into a reset release state (i.e., enable state) when the low voltage abnormality signal UVLO is at a high level.

The digital processing part 170 operates by receiving the power supply voltage VDD, and performs a process of monitoring various input signals and a process of generating various output signals. Furthermore, the digital processing part 170 is reset by the low voltage abnormality signal UVLO. More specifically, the digital processing part 170 comes into a reset state (i.e., disable state) when the low voltage abnormality signal UVLO is at a low level, and comes into a reset release state (i.e., enable state) when the low voltage abnormality signal UVLO is at a high level. The internal configuration and operation of the digital processing part 170 will be described later.

The transistor 180 is connected between the RSTOUT pin (i.e., the output terminal of the reset output signal RSTOUT) and the ground terminal, and is turned on and off in response to a gate signal G0 inputted from the digital processing part 170. The reset output signal RSTOUT is at a low level (i.e., logic level at the time of reset) when the transistor 181 is turned on, and is at a high level (i.e., logic level at the time of reset release) when the transistor 181 is turned off.

The transistor 181 is connected between the PG1 pin (i.e., the output terminal of the power good signal PG1) and the ground terminal, and is turned on and off in response to a gate signal G1 inputted from the digital processing part 170. The power good signal PG1 is at a low level (i.e., logic level at the abnormal time) when the transistor 181 is turned on, and is at a high level (i.e., logic level at the normal time) when the transistor 181 is turned off.

The transistor 182 is connected between the PG2 pin (i.e., the output terminal of the power good signal PG2) and the ground terminal, and is turned on and off in response to a gate signal G2 inputted from the digital processing part 170. The power good signal PG2 is at a low level (i.e., logic level at the abnormal time) when the transistor 182 is turned on, and is at a high level (i.e., logic level at the normal time) when the transistor 182 is turned off.

The transistor 183 is connected between the PG3 pin (i.e., the output terminal of the power good signal PG3) and the ground terminal, and is turned on and off in response to a gate signal G3 inputted from the digital processing part 170. The power good signal PG3 is at a low level (i.e., logic level at the abnormal time) when the transistor 183 is turned on, and is at a high level (i.e., logic level at the normal time) when the transistor 183 is turned off.

The transistor 184 is connected between the PG4 pin (i.e., the output terminal of the power good signal PG4) and the ground terminal, and is turned on and off in response to a gate signal G4 inputted from the digital processing part 170. The power good signal PG4 is at a low level (i.e., logic level at the abnormal time) when the transistor 184 is turned on, and is at a high level (i.e., logic level at the normal time) when the transistor 184 is turned off.

The buffer 190 operates by receiving the power supply voltage VDD, buffers an input signal (i.e., internal watchdog enable signal WDEN2 described later) inputted from the digital processing part 170, and outputs the input signal to the WDOUT pin (i.e., output terminal of watchdog output signal WDOUT).

<Digital Processing Part>

Subsequently, the internal configuration of the digital processing part 170 will be described with reference to FIG. 2. The digital processing part 170 of this configuration example includes a self-diagnosis part 171, a clock detection part 172, a watchdog timer 173, filters FLT0 to FLT4, counters CNT0 to CNT5, OR gates OR0 to OR4 and OR10 to OR14, an AND gate AND1, and an inverter INV1.

When the monitoring IC 100 is started up, the self-diagnosis part 171 checks each of the reference voltage detection signal VREF_DET and the comparison signals (RSTOVD, RSTUVD, DINxOVD and DINxUVD), whereby the self-diagnosis part 171 performs a self-diagnosis operation (hereinafter abbreviated as BIST) as to whether or not each of the reference voltage detection part 120 and the comparators 150 to 159 is functioning or operating normally and generates a BIST error signal BIST_ERROR. The BIST error signal BIST_ERROR becomes a high level when an abnormality is detected in any one of the reference voltage detection part 120 and the comparators 150 to 159.

In addition, the self-diagnosis part 171 generates a BIST enable signal BIST_EN and sends it to each of the reference voltage detection part 120 and the comparators 150 to 159. The BIST enable signal BIST_EN is at a high level during execution of the BIST.

The clock detection part 172 detects a frequency abnormality of the clock signals CLK1 and CLK2 and generates a clock detection signal CLK_DET. The clock detection signal CLK_DET is at a high level when the frequency abnormality of the clock signal CLK1 or CLK2 is detected.

The watchdog timer 173 counts the number of pulses of the clock signal CLK2, and raises the watchdog detection signal WDT_DET to a high level (i.e., logic level at the abnormal time) when the counter value reaches a SLOW abnormality detection threshold value. However, the counter value of the watchdog timer 173 is reset by the pulse of the watchdog input signal WDIN inputted from the WDIN pin. Therefore, as long as the pulse of the watchdog input signal WDIN is periodically inputted until the counter value of the watchdog timer 173 reaches the SLOW abnormality detection threshold value, the watchdog detection signal WDT_DET is kept at a low level (i.e., logic level at the normal time). The watchdog timer 173 also has a function of detecting a FAST abnormality of the watchdog input signal WDIN. More specifically, when the counter value does not reach a FAST abnormality detection threshold value (<SLOW abnormality detection threshold value) during the pulse period of the watchdog input signal WDIN, the watchdog timer 173 raises the watchdog detection signal WDT_DET to a high level. The WDIN pin is pulled down inside the monitoring IC 100.

The OR gate OR0 performs an OR operation of the comparison signals RSTOVD and RSTUVD. Therefore, the output signal of the OR gate OR 0 becomes a high level when at least one of the comparison signals RSTOVD and RSTUVD is at a high level, and becomes a low level when both the comparison signals RSTOVD and RSTUVD are at a low level.

The OR gate OR1 performs an OR operation of the comparison signals DIN1OVD and DIN1UVD. Therefore, the output signal of the OR gate OR1 becomes a high level when at least one of the comparison signals DIN1OVD and DIN1UVD is at a high level, and becomes a low level when both the comparison signals DIN1OVD and DIN1UVD are at a low level.

The OR gate OR2 performs an OR operation of the comparison signals DIN2OVD and DIN2UVD. Therefore, the output signal of the OR gate OR2 becomes a high level when at least one of the comparison signals DIN2OVD and DIN2UVD is at a high level, and becomes a low level when both the comparison signals DIN2OVD and DIN2UVD are at a low level.

The OR gate OR3 performs an OR operation of the comparison signals DIN3OVD and DIN3UVD. Therefore, the output signal of the OR gate OR3 becomes a high level when at least one of the comparison signals DIN3OVD and DIN3UVD is at a high level, and becomes a low level when both the comparison signals DIN3OVD and DIN3UVD are at a low level.

The OR gate OR4 performs an OR operation of the comparison signals DIN4OVD and DIN4UVD. Therefore, the output signal of the OR gate OR4 becomes a high level when at least one of the comparison signals DIN4OVD and DIN4UVD is at a high level, and becomes a low level when both the comparison signals DIN4OVD and DIN4UVD are at a low level.

Each of the filters FLT0 to FLT4 performs a predetermined filtering process on the output signals of the OR gates OR0 to OR4 and outputs the result to a subsequent stage. However, the filters FLT0 to FLT4 are not indispensable components. When there is no concern of noise or the like, the filters FLT0 to FLT4 may be omitted and the output signals of the OR gates OR0 to OR4 may be passed to the subsequent stage.

Each of the counters CNT0 to CNT4 performs a predetermined counter process on the output signals of the filters FLT0 to FLT4 and outputs the result to a subsequent stage. The output signal of the counter CNT0 is outputted to the OR gate OR10 as a reset input detection signal RST_IN. However, the counters CNT0 to CNT4 are not indispensable components. When there is no concern of noise or the like, the counters CNT0 to CNT4 may be omitted and the output signals of the OR gates OR0 to OR4 (or the output signals of the filters FLT0 to FLT4) may be passed to a subsequent stage.

The OR gate OR10 performs a logical sum operation of the reference voltage detection signal VREF_DET, the reset input detection signal RSTIN_DET, the BIST abnormality detection signal BIST_ERROR, the watchdog detection signal WDT_DET and the clock detection signal CLK_DET, thereby generating a reset output detection signal RSTOUT_DET. Therefore, the reset output detection signal RSTOUT_DET becomes a high level when any one of a plurality of input signals is at a high level, and becomes a low level when all of them are at a low level. The reset output detection signal RSTOUT_DET is outputted to the gate of the transistor 180 as the aforementioned gate signal G0.

The OR gates OR11 to OR14 generate power good detection signals PG1_DET to PG4_DET, respectively, by performing a logical sum operation of the output signals of the counters CNT1 to CNT4 and the reference voltage detection signal VREF_DET. Therefore, when the reference voltage detection signal VREF_DET is at a low level, the output signals of the counters CNT1 to CNT4 are directly outputted as the power good detection signals PG1_DET to PG4_DET. On the other hand, when the reference voltage detection signal VREF_DET is at a high level, all the power good detection signals PG1_DET to PG4_DET are fixed or set to a high level irrespective of the output signals of the counters CNT1 to CNT4. The power good detection signals PG1_DET to PG4_DET are outputted to the gates of the transistors 181 to 184 as the aforementioned gate signals G1 to G4, respectively.

The counter CNT5 performs a predetermined counter process on the watchdog enable signal WDEN inputted from the WDEN pin and outputs the result. The WDEN pin is pulled down inside the monitoring IC 100. However, the counter CNT5 is not an indispensable component. When there is no concern of noise or the like, the counter CNT5 may be omitted and the watchdog enable signal WDEN may be passed to a subsequent stage.

The inverter INV1 logically inverts the reset output detection signal RSTOUT_DET and outputs the same. Therefore, the output signal of the inverter INV1 becomes a low level when the reset output detection signal RSTOUT_DET is at a high level (i.e., logic level at the time of abnormality detection), and becomes a high level when the reset output detection signal RSTOUT_DET is at a low level (i.e., logic level at the time of non-detection of abnormality).

The AND gate AND1 performs a logical product operation of the output signal of the counter CNT5 and the output signal of the inverter INV1, and outputs the result to the watchdog timer 173 as an internal watchdog enable signal WDEN2. Therefore, when the output signal of the inverter INV1 is at a high level, the output signal of the counter CNT5 is directly outputted as the internal watchdog enable signal WDEN2. On the other hand, when the output signal of the inverter INV1 is at a low level, the internal watchdog enable signal WDEN2 is fixed or set to a low level irrespective of the output signal of the counter CNT5.

The watchdog timer 173 becomes valid (i.e., enable state) when the internal watchdog enable signal WDEN2 is at a high level, and becomes invalid (i.e., disable state) when the internal watchdog enable signal WDEN2 is at a low level.

The internal watchdog enable signal WDEN2 is outputted to the WDOUT pin (i.e., the output terminal of the watchdog output signal WDOUT) via the buffer 190. That is, the watchdog output signal WDOUT is a binary signal equivalent to the internal watchdog enable signal WDEN2, and serves as a status signal for notifying the microcomputer 300 of the validity/invalidity of the watchdog timer 173.

The monitoring IC 100 having the above configuration has a self-diagnosis function of the monitoring mechanism, a self-monitoring function of the internal clock, a monitoring function of the control terminal, and the like in order to increase the failure detection rate. In the following, these new functions will be specifically described one by one.

<Startup Sequence>

Figure 3:
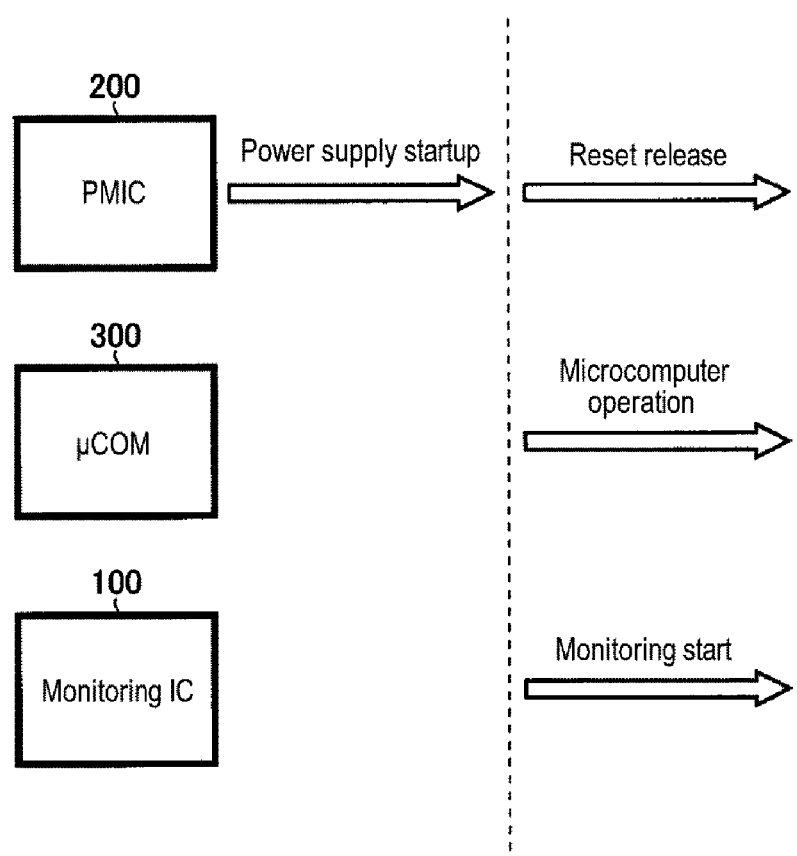
FIG. 3 is a schematic diagram showing a first startup sequence.

FIG. 3 is a schematic diagram showing a first startup sequence (i.e., general startup sequence) in the electronic device 1. In the startup sequence of this figure, after the power supply is started up by the power management IC 200, the monitoring IC 100 and the microcomputer 300 start their respective operations in response to the reset release from the power management IC 200.

Thus, the general startup sequence is not intended for the monitoring IC 100 with a self-diagnosis function. Therefore, the execution timing of the BIST in the monitoring IC 100 is after the reset release from the power management IC 200, consequently affecting the startup time of the entire electronic device 1. Moreover, the microcomputer 300 cannot determine the execution timing of the BIST. In the following, a second startup sequence that can solve such problems is suggested.

Figure 4:
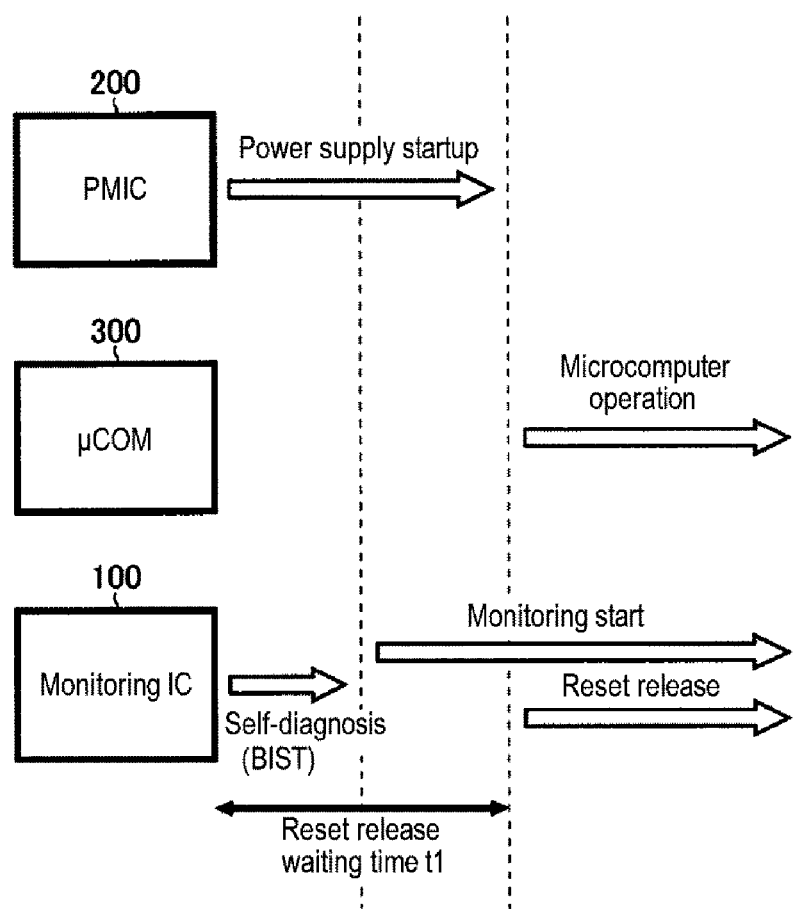
FIG. 4 is a schematic diagram showing a second startup sequence.

FIG. 4 is a schematic diagram showing a second startup sequence (i.e., new startup sequence) in the electronic device 1. In the startup sequence of this figure, after the power supply is started up by the power management IC 200, a BIST is performed in the monitoring IC 100 until a predetermined reset release waiting time t1 (to be described in detail later) elapses. Then, if no abnormality is detected in the monitoring IC 100, a monitoring operation is promptly started. Furthermore, the reset release of the microcomputer 300 is performed when the reset release waiting time t1 elapses (e.g., on or after the elapse time point). As a result, the operation of the microcomputer 300 is started.

As described above, the monitoring IC 100 is provided with both the self-diagnosis function and the reset output function. By adopting such a configuration, the BIST can be performed without any influence on the operation start timing of the microcomputer 300, so that the electronic device 1 can be started up at the same timing as before.

In addition, the monitoring IC 100 can start the original monitoring operation after self-diagnosing whether or not the monitoring IC 100 operates normally. Therefore, it is possible to increase the failure detection rate.

Figure 5:
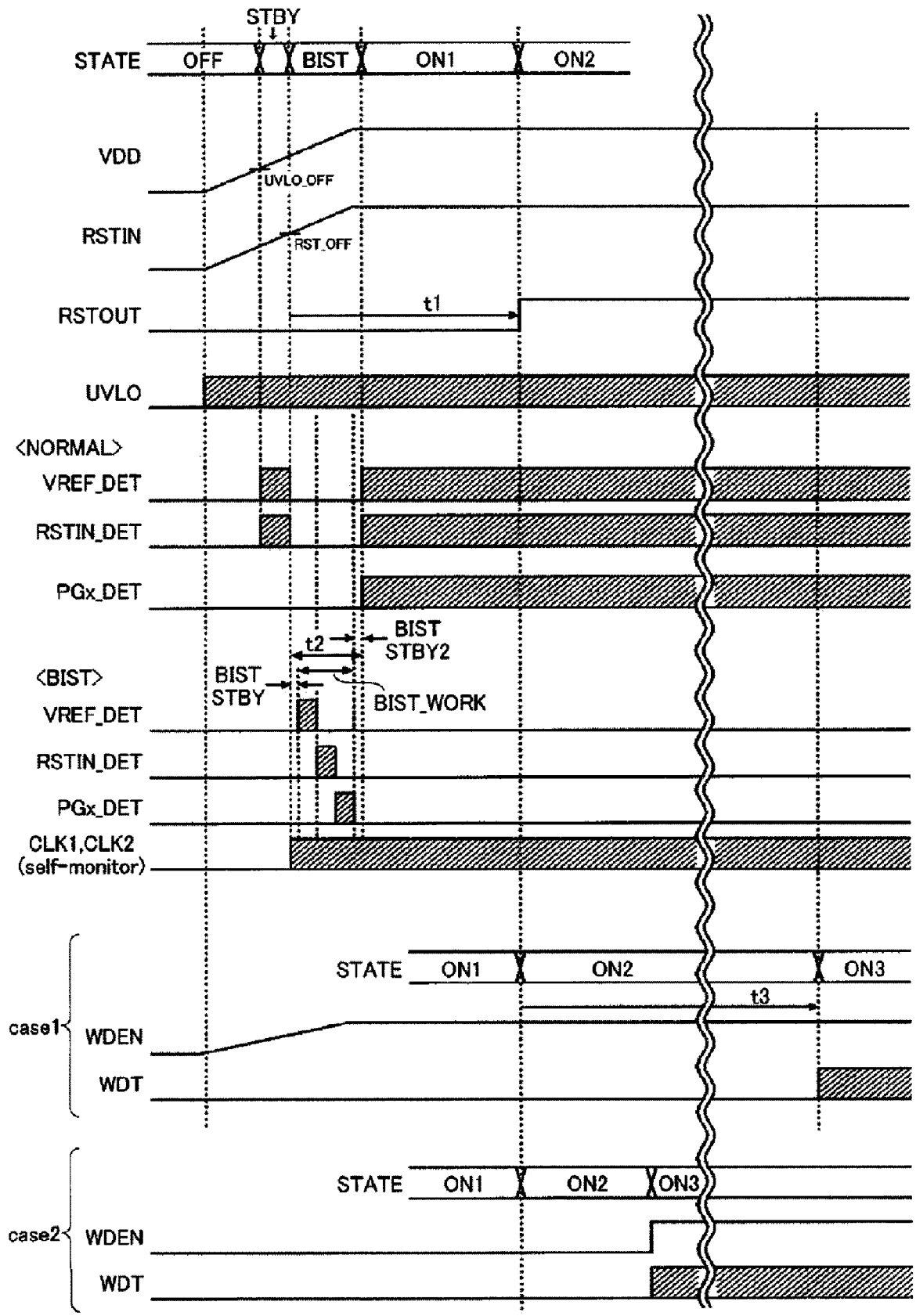
FIG. 5 is a timing chart showing the second startup sequence.

FIG. 5 is a timing chart for more specifically explaining the above-described second startup sequence. From the upper stage to the middle stage of this figure, the self-monitoring states of the operation state (STATE) of the monitoring IC 100, the power supply voltage VDD, the reset input signal RSTIN (i.e., corresponding to the input voltage V0 in FIG. 2), the reset output signal RSTOUT, the low voltage abnormality signal UVLO, various detection signals (VREF_DET, RSTIN_DET and PGx_DET) in a normal mode, various detection signals (VREF_DET, RSTIN_DET and PGx_DET) in a BIST mode and the clock signals CLK1 and CLK2 are depicted sequentially from the upper side.

In the lower stage of the figure, the operation start behaviors (STATE, WDEN and WDT) of the watchdog timer 173 are divisionally depicted as a first case (i.e., for example, a case where the WDEN pin is short-circuited to the VDD pin outside the IC and a second case (i.e., a case where the WDEN pin is controlled by the microcomputer 300).

The signals hatched in the figure indicate that the respective detection operations (or the generation operations) are active.

When the power management IC 200 is started up to supply the power supply voltage VDD to the monitoring IC 100, the detection operation of the low voltage abnormality signal UVLO becomes active. If the power supply voltage VDD rises to the low voltage abnormality release value UVLO_OFF, the monitoring IC 100 is shifted from an OFF state to a STBY state. The OFF state corresponds to a state in which all the circuit parts except the UVLO part 130 are shut down. On the other hand, the STBY state corresponds to a state in which UVLO is released and the oscillators 161 and 162 are starting their respective oscillation operations. In the STBY state, the detection operations of the reference voltage detection signal VREF_DET and the reset input detection signal RSTIN_DET become active. The low voltage abnormality release value UVLO_OFF may be set based on the minimum operable voltage of the monitoring IC 100.

Thereafter, if the reset input signal RSTIN (i.e., the divided voltage of the power supply voltage VDD) rises to the reset release value RST_OFF, the monitoring IC 100 is shifted from the STBY state to the BIST state. Then, the self-monitoring operation of the clock signals CLK1 and CLK2 becomes active. Simultaneously with the shift from the STBY state to the BIST state, the count of the reset release waiting time t1 (for example, 10 ms) is started. The reset release value RST_OFF may be set based on the minimum operable voltage of the microcomputer 300.

The BIST state may be subdivided into three states, i.e., a BIST_STBY state (corresponding to the start standby state of the BIST), a BIST_WORK state (corresponding to the execution state of the BIST) and a BIST_STBY2 state (corresponding to the result determination state of the BIST).

In particular, in the BIST_WORK state, the detection operations of the reference voltage detection signal VREF_DET, the reset input detection signal RSTIN_DET and the power good detection signal PGx_DET are sequentially made active. The method of BIST will be described in detail later with specific examples.

In addition, the BIST required time t2 for circulating the above three states is sufficiently shorter than the above-described reset release waiting time t1 (may be, for example, about 1 ms).

When the BIST normally comes to an end, the monitoring IC 100 is shifted from the BIST state to the ON1 state. Then, all the detection operations of the reference voltage detection signal VREF_DET, the reset input detection signal RSTIN_DET and the power good detection signal PGx_DET (i.e., the original monitoring operations) are made active. The ON1 state corresponds to a state available until the BIST normally comes to an end and the reset of the reset output signal RSTOUT is released.

Thereafter, when the reset release waiting time t1 elapses, the monitoring IC 100 is shifted from the ON1 state to the ON2 state, the reset output signal RSTOUT rises to a high level, and the reset of the microcomputer 300 is released. However, at this point in time, the watchdog timer 173 remains invalid. In this manner, the ON2 state corresponds to a state available until the watchdog timer 173 starts the detection operation after the reset of the microcomputer 300 is released.

As shown in the first case, when the WDEN pin is short-circuited to the VDD pin outside the monitoring IC 100 and when the watchdog enable signal WDEN is at a high level before the shift to the ON2 state, the monitoring IC 100 is shifted from the ON2 state to the ON3 state at the time at which a predetermined watchdog waiting time t3 (for example, 500 ms) elapses after the reset output signal RSTOUT is raised to a high level. The watchdog timer 173 starts the detection operation.

On the other hand, as shown in the second case, when the watchdog enable signal WDEN is controlled by the microcomputer 300 and when the watchdog enable signal WDEN is set to a high level after the shift to the ON2 state, the monitoring IC 100 is shifted from the ON2 state to the ON3 state without delay at the time at which the watchdog enable signal WDEN is raised to a high level. The watchdog timer 173 starts the detection operation.

As described above, the monitoring IC 100 includes a monitoring part (i.e., the reference voltage detection part 120 and the comparators 150 to 159) for detecting an abnormality of a monitoring target, a self-diagnosis part 171 for diagnosing whether or not the monitoring part is normally functioning during a period from the start of the power supply to the elapse of the reset release waiting time t1, and a reset control part (see the reset control part CTRL in FIGS. 25 and 26) for releasing the reset of the reset output signal RSTOUT after the reset release waiting time t1 elapses. By adopting such a configuration, it is possible to increase the failure detection rate without affecting the startup timing of the electronic device 1.

The monitoring IC 100 performs the BIST until a predetermined reset release waiting time t1 elapses after the reset input signal RSTIN reaches a reset release value RST_OFF. After confirming that its own monitoring function is normal, the monitoring IC 100 releases the reset of the reset output signal RSTOUT. The microcomputer 300 does not merely incorporate the conventional power-on reset function (i.e., the function of immediately releasing the reset when the monitoring target voltage reaches a predetermined value).

Figure 6:
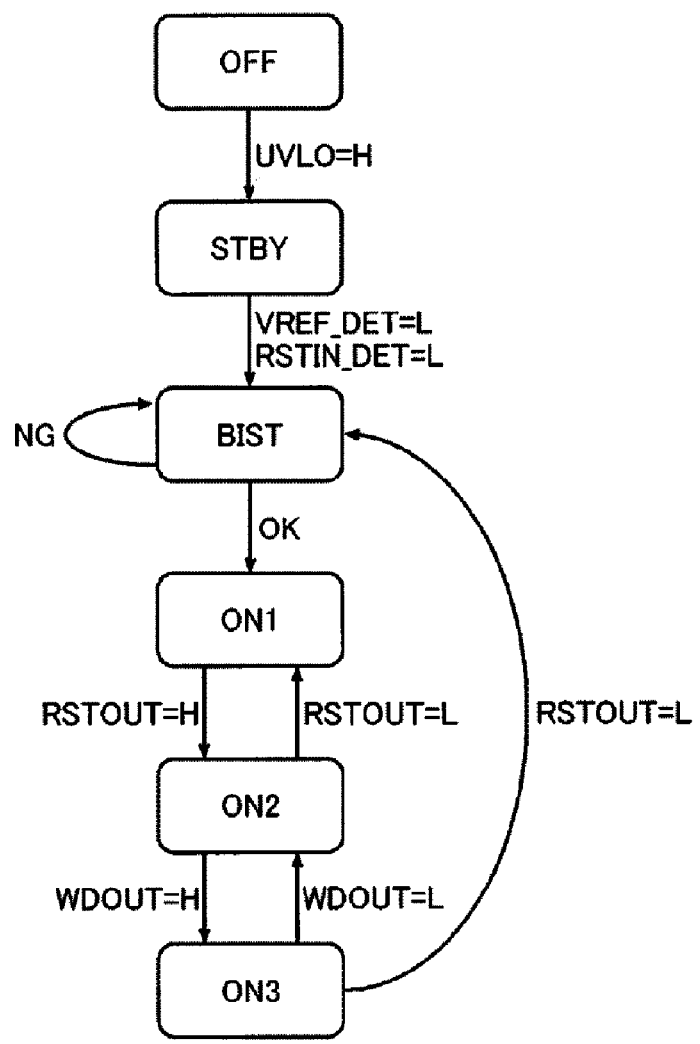
FIG. 6 is a state transition diagram showing the second startup sequence.

FIG. 6 is a state transition diagram (i.e., state machine diagram) showing the second startup sequence. Various states (OFF, STBY, BIST, ON1, ON2 and ON3) in this figure correspond to the various states shown in FIG. 5.

Briefly, the OFF state is shifted to the STBY state by UVLO=H. The STBY state is shifted to the BIST state by VREF_DET=RSTIN_DET=L. The BIST state is shifted to the ON1 state by OK determination. The ON1 state is shifted to the ON2 state by RSTOUT=H. The ON2 state is shifted to the ON3 state by WDOUT=H and is shifted to the ON1 state by RSTOUT=L. The ON3 state is shifted to the ON2 state by WDOUT=L and is shifted to the BIST state by RSTOUT=L.

Incidentally, as the number of diagnosis targets of the BIST (the reference voltage detection part 120 and the comparators 150 to 159 in the present configuration example) increases, an unintended NG determination is likely to occur in the BIST state due to a transient external factor such as noise or the like. If such an NG determination is trusted with ease and a subsequent process is stopped, it is impossible to normally start up the monitoring IC 100, which is very inconvenient.

Therefore, the self-diagnosis part 171 repeats the diagnosis until it is confirmed that the diagnosis target of the BIST is functioning normally. That is, as shown in FIG. 6, the BIST state is repeated any number of times as long as the NG determination is made. At this time, as a matter of course, the reset output signal RSTOUT is kept at a low level. In addition, the self-diagnosis part 171 raises the BIST error signal BIST_ERROR to a high level and stores a BIST error flag in a register (details of which will be described later).

By adopting such a startup sequence, even if a transient abnormality occurs in the diagnosis result of the BIST, a true diagnosis result can be obtained by repeating the BIST. Accordingly, it is possible to improve the noise immunity of the monitoring IC 100.

As described above, the BIST required time t2 is sufficiently shorter than the reset release waiting time t1. Therefore, even if the BIST is repeated twice or three times, the reset release timing of the microcomputer 300 is not delayed.

<Test Circuit>

Figure 7:
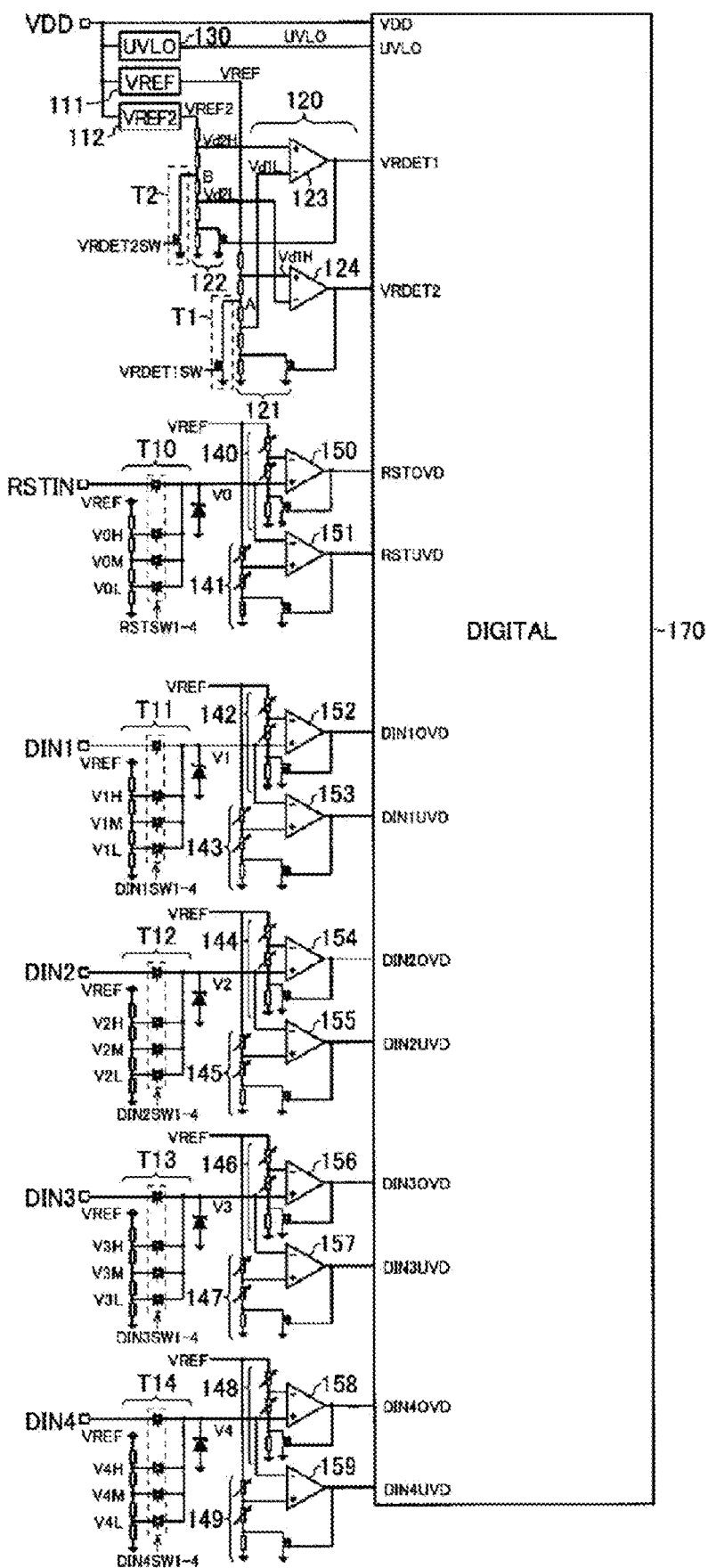
FIG. 7 is a circuit diagram showing a configuration example of a test circuit.

FIG. 7 is a circuit diagram showing a configuration example of a test circuit. As shown in the figure, the monitoring IC 100 incorporates a plurality of test circuits (T1, T2 and T10 to T14) as a means for implementing the BIST described above.

The test circuits T1 and T2 are attached to the reference voltage detection part 120. More specifically, the reference voltage detection part 120 includes divided voltage generation parts 121 and 122, and comparators 123 and 124. The test circuits T1 and T2 are connected to the divided voltage generation parts 121 and 122, respectively.

The divided voltage generation part 121 generates divided voltages Vd1H and Vd1L (where Vd1H>Vd1L) from the reference voltage VREF.

The divided voltage generation part 122 generates divided voltages Vd2H and Vd2L (where Vd2H>Vd2L) from the sub reference voltage VREF2.

The comparator 123 generates a comparison signal VRDET1 by comparing the divided voltage Vd2H inputted to a non-inverting input terminal (+) and the divided voltage Vd1L inputted to an inverting input terminal (−). The comparison signal VRDET1 becomes a high level when Vd2H>Vd1L, and becomes a low level when Vd2H<Vd1L.

The comparator 124 generates a comparison signal VRDET2 by comparing the divided voltage Vd1H inputted to a non-inverting input terminal (+) and the divided voltage Vd2L inputted to an inverting input terminal (−). The comparison signal VRDET2 becomes a high level when Vd1H>Vd2L, and becomes a low level when Vd1H<Vd2L.

The test circuit T1 is connected to a midpoint node A (i.e., an intermediate node sandwiched between the output terminals of the divided voltages Vd1H and Vd1L) of the divided voltage generation part 121. The test circuit T1 switches the voltage value of the midpoint node A in response to the control signal VRDET1SW. More specifically, the test circuit T1 opens the midpoint node A when VRDET1SW=L, and short-circuits the midpoint node A to the ground terminal when VRDET1SW=H.

The test circuit T2 is connected to a midpoint node B (i.e., an intermediate node sandwiched between the output terminals of the divided voltages Vd2H and Vd2L) of the divided voltage generation part 122. The test circuit T2 switches the voltage value of the midpoint node B in response to the control signal VRDET2SW. More specifically, the test circuit T2 opens the midpoint node B when VRDET2SW=L, and short-circuits the midpoint node B to the ground terminal when VRDET2SW=H.

The test circuit T10 is connected to the input terminal of the input voltage V0. The test circuit T10 switches the voltage value of the input voltage V0 in response to the control signals RSTSW1 to RSTSW4 (i.e., binary signals alternatively set to a high level). More specifically, the test circuit T10 sets V0 to RSTIN when RSTSW1=H, sets V0 to V0H (for example, 1.04 V) when RSTSW2=H, sets V0 to V0M (for example, 0.8 V) when RSTSW3=H, and sets V0 to V0L (for example, 0.56 V) when RSTSW4=H. The three test input voltages (V0H, V0M and V0L) may be respectively generated by dividing the reference voltage VREF.

The test circuit T11 is connected to the input terminal of the input voltage V1. The test circuit T11 switches the voltage value of the input voltage V1 in response to the control signals DIN1SW1 to DIN1SW4 (i.e., binary signals alternatively set to a high level). More specifically, the test circuit T11 sets V1 to DIN1 when DIN1SW1=H, sets V1 to V1H (for example, 1.04 V) when DIN1SW2=H, sets V1 to V1M (for example, 0.8 V) when DIN1SW3=H, and sets V1 to V1L (for example, 0.56 V) when DIN1SW4=H. The three test input voltages (V1H, V1M and V1L) may be respectively generated by dividing the reference voltage VREF.

The test circuit T12 is connected to the input terminal of the input voltage V2. The test circuit T12 switches the voltage value of the input voltage V2 in response to the control signals DIN2SW1 to DIN2SW4 (i.e., binary signals alternatively set to a high level). More specifically, the test circuit T12 sets V2 to DIN2 when DIN2SW1=H, sets V2 to V2H (for example, 1.04 V) when DIN2SW2=H, sets V2 to V2M (for example, 0.8 V) when DIN2SW3=H, and sets V2 to V2L (for example, 0.56 V) when DIN2SW4=H. The three test input voltages (V2H, V2M and V2L) may be respectively generated by dividing the reference voltage VREF.

The test circuit T13 is connected to the input terminal of the input voltage V3. The test circuit T13 switches the voltage value of the input voltage V3 in response to the control signals DIN3SW1 to DIN3SW4 (i.e., binary signals alternatively set to a high level). More specifically, the test circuit T13 sets V3 to DIN3 when DIN3SW1=H, sets V3 to V3H (for example, 1.04 V) when DIN3SW2=H, sets V3 to V3M (for example, 0.8 V) when DIN3SW3=H, and sets V3 to V3L (for example, 0.56 V) when DIN3SW4=H. The three test input voltages (V3H, V3M and V3L) may be respectively generated by dividing the reference voltage VREF.

The test circuit T14 is connected to the input terminal of the input voltage V4. The test circuit T14 switches the voltage value of the input voltage V4 in response to the control signals DIN4SW1 to DIN4SW4 (i.e., binary signals alternatively set to a high level). More specifically, the test circuit T14 sets V4 to DIN4 when DIN4SW1=H, sets V4 to V4H (for example, 1.04 V) when DIN4SW2=H, sets V4 to V4M (for example, 0.8 V) when DIN4SW3=H, and sets V4 to V4L (for example, 0.56 V) when DIN4SW4=H. The three test input voltages (V4H, V4M and V4L) may be respectively generated by dividing the reference voltage VREF.

<BIST>

Figure 8:
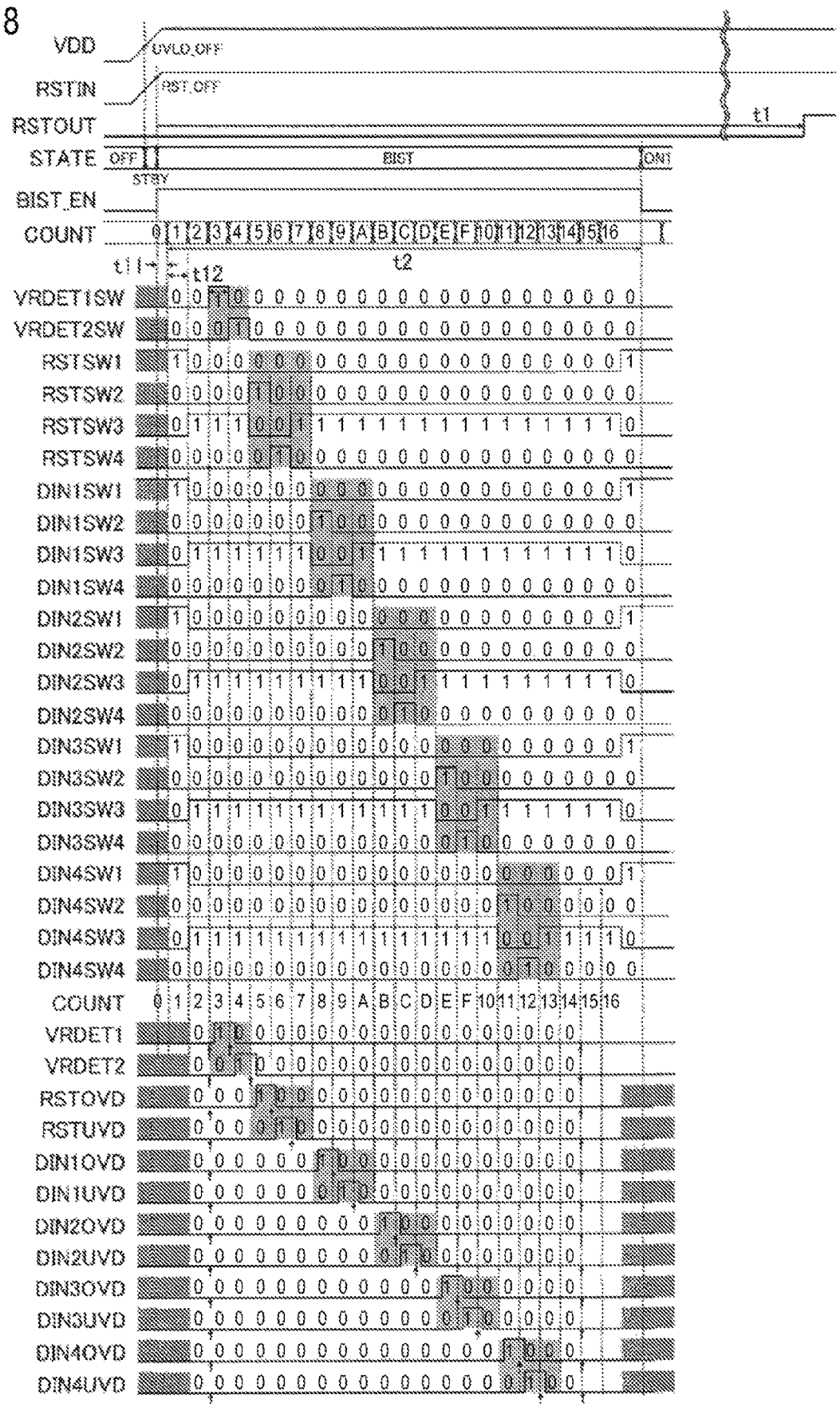
FIG. 8 is a timing chart showing a first embodiment of a BIST.

FIG. 8 is a timing chart showing a first embodiment of the BIST. The power supply voltage VDD, the reset input signal RSTIN, the reset output signal RSTOUT, the operation state (STATE) of the monitoring IC 100, the BIST enable signal BIST_EN, the counter value (COUNT) of the clock signal CLK1, various control signals (VRDET1SW, VRDET2SW, RSTSW1 to RSTSW4, DIN1SW1 to DIN1SW4, DIN2SW1 to DIN2SW4, DIN3SW1 to DIN3SW4 and DIN4SW1 to DIN4SW4), the counter value COUNT (the same as the previous one), various detection signals (VRDET1, VRDET2, RSTOVD, RSTUVD, DIN1OVD, DIN1UVD, DIN2OVD, DIN2UVD, DIN3OVD, DIN3UVD, DIN4OVD and DIN4UVD) are depicted sequentially from the upper side.

At the increment timing of the counter value COUNT, the upward arrows attached to the various detection signals indicate the comparison timing for determining the match/mismatch of the detected value and the expected value.

As shown in this figure, the detection operation of the BIST is sequentially advanced in synchronization with the counter value COUNT of the clock signal CLK1. The rising timing of the BIST enable signal BIST_EN and the increment timing of the counter value COUNT are asynchronous with each other. Therefore, the delay time t11 from the rise of the BIST enable signal BIST_EN to the high level to the start of the increment of the counter value COUT is 0 µs at the minimum and is equal to the increment period t12 (for example, several tens µs) of the counter value COUNT at the maximum.

When COUNT="1", the control signals (RSTSW1, DIN1SW1, DIN2SW1, DIN3SW1 and DIN4SW1) among the various control signals are at a high level, and all other control signals are at a low level. Therefore, both the nodes A and B in FIG. 7 are opened. In addition, V0=RSTIN, V1=DIN', V2=DIN2, V3=DIN3, and V4=DIN4.

When COUNT="2", the control signals (RSTSW3, DIN1SW3, DIN2SW3, DIN3SW3 and DIN4SW3) among the various control signals are at a high level, and all other control signals are at a low level. Therefore, both the nodes A and B in FIG. 7 are kept opened. In addition, V0=V0M, V1=V1M, V2=V2M, V3=V3M, and V4=V4M. At this time, if the monitoring part (the reference voltage detection part 120 and the comparators 150 to 159) to be diagnosed by the BIST is normal, all the detection signals should be at a low level.

When COUNT="3", the control signal VRDET1SW goes to a high level while taking the state of COUNT="2" as a base. Therefore, the node A in FIG. 7 is short-circuited to the ground terminal. At this time, if the monitoring part is normal, only the detection signal VRDET1 is at a high level and all other detection signals should be at a low level.

When COUNT="4", the control signal VRDET2SW goes to a high level while taking the state of COUNT="2" as a base. Therefore, the node B in FIG. 7 is short-circuited to the ground terminal. At this time, if the monitoring part is normal, only the detection signal VRDET2 is at a high level and all other detection signals should be at a low level.

When COUNT="5", the control signal RSTSW2 goes to a high level and the control signal RSTSW3 goes to a low level while taking the state of COUNT="2" as a base. Therefore, V0=V0H. At this time, if the monitoring part is normal, only the detection signal RSTOVD is at a high level and all other detection signals should be at a low level.

When COUNT="6", the control signal RSTSW4 goes to a high level and the control signal RSTSW3 goes to a low level while taking the state of COUNT="2" as a base. Therefore, V0=V0L. At this time, if the monitoring part is normal, only the detection signal RSTUVD is at a high level and all other detection signals should be at a low level.

When COUNT="7", the state is returned to the same state as the state of COUNT="2". Therefore, if the monitoring part is normal, all the detection signals should be at a low level.

When COUNT="8", the control signal DIN1SW2 goes to a high level and the control signal DIN1SW3 goes to a low level while taking the state of COUNT="7" as a base. Therefore, V1=V1H. At this time, if the monitoring part is normal, only the detection signal DIN1OVD is at a high level and all other detection signals should be at a low level.

When COUNT="9", the control signal DIN1SW4 goes to a high level and the control signal DIN1SW3 goes to a low level while taking the state of COUNT="7" as a base. Therefore, V1=V1L. At this time, if the monitoring part is normal, only the detection signal DIN1UVD is at a high level and all other detection signals should be at a low level.

When COUNT="A", the state is returned to the same state as the state of COUNT="7". Therefore, if the monitoring part is normal, all the detection signals should be at a low level.

When COUNT="B", the control signal DIN2SW2 goes to a high level and the control signal DIN2SW3 goes to a low level while taking the state of COUNT="A" as a base. Therefore, V2=V2H. At this time, if the monitoring part is normal, only the detection signal DIN2OVD is at a high level and all other detection signals should be at a low level.

When COUNT="C", the control signal DIN2SW4 goes to a high level and the control signal DIN2SW3 goes to a low level while taking the state of COUNT="A" as a base. Therefore, V2=V2L. At this time, if the monitoring part is normal, only the detection signal DIN2UVD is at a high level and all other detection signals should be at a low level.

When COUNT="D", the state is returned to the same state as the state of COUNT="A". Therefore, if the monitoring part is normal, all the detection signals should be at a low level.

When COUNT="E", the control signal DIN3SW2 goes to a high level and the control signal DIN3SW3 goes to a low level while taking the state of COUNT="D" as a base. Therefore, V3=V3H. At this time, if the monitoring part is normal, only the detection signal DIN3OVD is at a high level and all other detection signals should be at a low level.

When COUNT="F", the control signal DIN3SW4 goes to a high level and the control signal DIN3SW3 goes to a low level while taking the state of COUNT="D" as a base. Therefore, V3=V3L. At this time, if the monitoring part is normal, only the detection signal DIN3UVD is at a high level and all other detection signals should be at a low level.

When COUNT="10", the state is returned to the same state as the state of COUNT="D". Therefore, if the monitoring part is normal, all the detection signals should be at a low level.

When COUNT="11", the control signal DIN4SW2 goes to a high level and the control signal DIN4SW3 goes to a low level while taking the state of COUNT="10" as a base. Therefore, V4=V4H. At this time, if the monitoring part is normal, only the detection signal DIN4OVD is at a high level and all other detection signals should be at a low level.

When COUNT="12", the control signal DIN4SW4 goes to a high level and the control signal DIN4SW3 goes to a low level while taking the state of COUNT="10" as a base. Therefore, V4=V4L. At this time, if the monitoring part is normal, only the detection signal DIN4UVD is at a high level and all other detection signals should be at a low level.

When COUNT="13" to "16", the state is returned to the same state as the state of COUNT="10", and is then returned to the same state as the state of COUNT="1", whereby a series of BIST comes to an end.

By the way, in the BIST of the present embodiment, attention is paid only to the detection signal of the comparator to which the test input voltage is inputted, and the match/mismatch of the detected value and the expected value is determined. For example, when COUNT="8", the test input voltage V1H higher than the upper threshold voltage Vth1H is inputted as the input voltage V1 to the comparator 152. Therefore, only the detection signal DIN1OVD is compared with the expected value. These features may apply to other counter values in the same manner.

In such a BIST method, due to the layout factor of the monitoring IC 100 or the like, there is a possibility that, even if a plurality of comparators have an abnormality called "caught detection", this abnormality may be overlooked. In the following, the "caught detection" will be considered by taking, as an example, a case where the input terminals of the input voltages V1 and V2 are short-circuited to each other.

For example, in the case of COUNT="8", when V1=V1H, it is originally required that V2=V2M. However, V2 becomes substantially equal to V1H through a short path between V1 and V2. As a result, not only the detection signal DIN1OVD but also the detection signal DIN2OVD is caught to become a high level.

However, in the case of COUNT="8", only the detection signal DIN1OVD is compared with the expected value. Therefore, when the detection value of the detection signal DIN1OVD matches the expected value, even if the detection value of the detection signal DIN2OVD does not match the expected value, the diagnosis result of the BIST is "OK".

On the other hand, in the case of COUNT="B", when V2=V2H, it is originally required that V1=V1M. However, V1 becomes substantially equal to V2H through a short path between V1 and V2. As a result, not only the detection signal DIN2OVD but also the detection signal DIN1OVD is caught to become a high level.

However, in the case of COUNT="B", only the detection signal DIN2OVD is compared with the expected value. Therefore, when the detection value of the detection signal DIN2OVD matches the expected value, even if the detection value of the detection signal DIN1OVD does not match the expected value, the diagnosis result of the BIST is "OK".

As described above, in the BIST of the first embodiment, both of the detection signals DIN1OVD and DIN2OVD are diagnosed as "OK". Therefore, the "caught detection" caused by a short-circuit abnormality between V1 and V2 is overlooked.

In the above description, only the short-circuit abnormality between V1 and V2 has been taken as an example. However, in plural embodiments, abnormal patterns of "caught detection" exist just as much as the number of combinations of a plurality of channels. In particular, at the latter stage side (the inside of the chip of the monitoring IC 100) of each of the test circuits T10 to T14, the wiring spacing becomes very narrow. Therefore, in terms of layout, there is a high possibility of short-circuiting between the wirings. Ultimately, the "caught detection" is likely to occur.

Therefore, in order to improve the reliability of the monitoring IC 100, it is extremely important to correctly diagnose the "caught detection" described above. In the following, consideration will be given to a second embodiment of the BIST that can solve such a problem.

Figure 9:
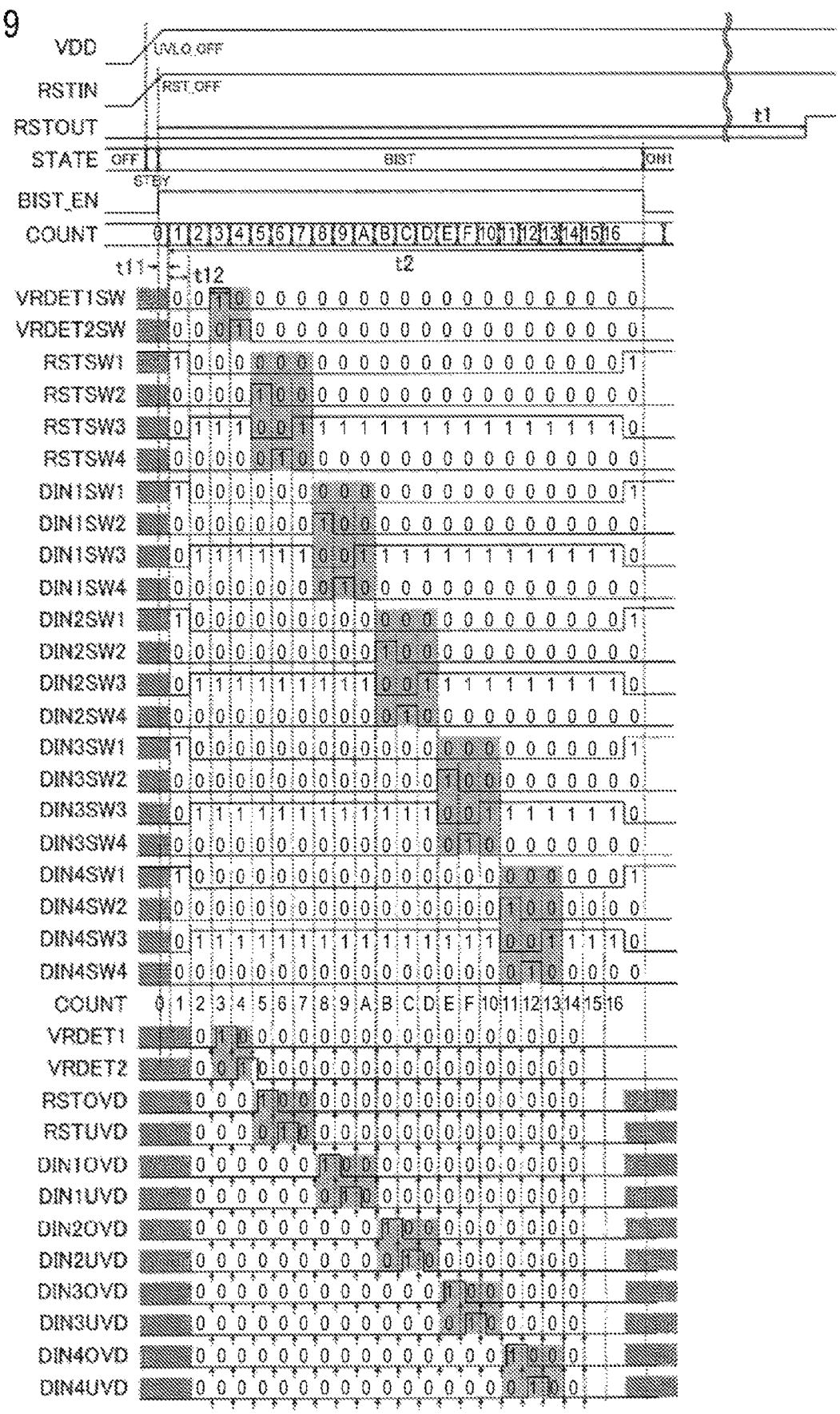
FIG. 9 is a timing chart showing a second embodiment of the BIST.

FIG. 9 is a timing chart showing a second embodiment of the BIST. The driving method of various control signals is the same as that of FIG. 8 described above. However, unlike the first embodiment described above, in the BIST of the present embodiment, the match/mismatch of the detected value and the expected value is determined with respect to not only the comparator to which the test input voltage is inputted but also all the comparators.

That is, while serially and sequentially switching diagnosis targets to be inputted with test input signals from among a plurality of monitoring mechanisms (for example, comparators 151 to 159) included in the monitoring part, the self-diagnosis part 171 determines whether or not the output signal of the monitoring mechanism serving as a diagnosis target matches the expected value and also determines whether or not the output signal of each of the monitoring mechanisms other than the monitoring mechanism serving as the diagnosis target matches the expected value.

For example, when COUNT="8", the test input voltage V1H is inputted to the comparator 152. However, with respect to not only the detection signal DIN1OVD outputted from the comparator 152 but also other detection signals, the detected value and the expected value are compared one by one.

Similarly, when COUNT="B", the test input voltage V2H is inputted to the comparator 152. However, with respect to not only the detection signal DIN1OVD outputted from the comparator 154 but also other detection signals, the detected value and the expected value are compared one by one.

According to such a BIST method, for example, even if the aforementioned "caught detection" has occurred due to the short-circuit abnormality between V1 and V2, it is possible to diagnose the "caught detection" as an abnormality and to make an NG determination. Therefore, it is possible to enhance the reliability of the monitoring IC 100.

However, when a plurality of comparators are inspected at the same time (for example, when V1=V1H and V2=V2H at the same timing), even if the output evaluation of all the comparators is performed at all comparison timings, it is impossible to correctly determine the "caught detection". For this reason, as a solution to the "caught detection", it is important to evaluate the output of all the comparators at all comparison timings while inspecting the respective comparators one by one.

In the above description, the advantage of the second embodiment has been described by paying attention to the "caught detection" occurring between channels. Hereinafter, from a different point of view, the difference between the first embodiment (FIG. 8) and the second embodiment (FIG. 9) will be described.

Figure 10:
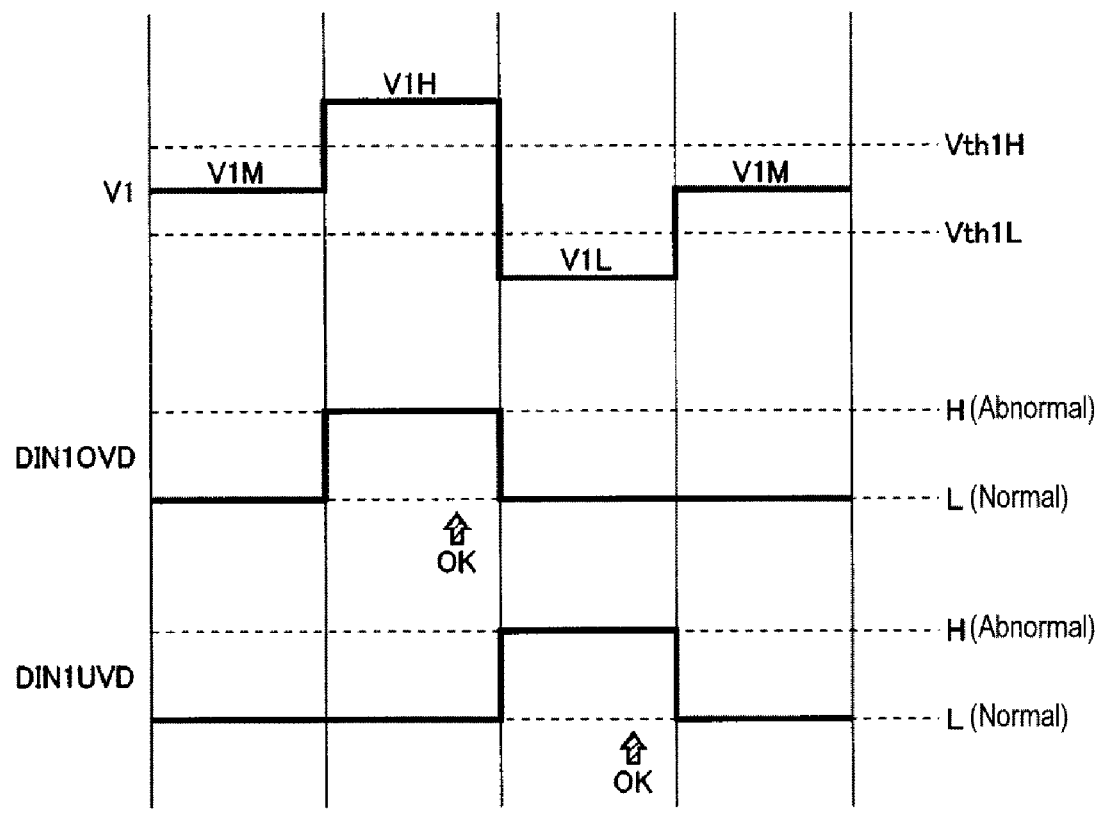
FIG. 10 is a timing chart showing an example of a diagnosis result in a first embodiment.

FIG. 10 is a timing chart showing an example of the diagnosis result (without H fixation) obtained by the BIST of the first embodiment (FIG. 8), in which the input voltage V1 and the detection signals DIN1OVD and DIN1UVD are depicted sequentially from the upper side.

As shown in this figure, for example, when the BIST is executed using the comparators 152 and 153 of FIG. 7 as diagnosis targets, the self-diagnosis part 171 determines whether or not the detected value of each of the detection signals DIN1OVD and DIN1UVD matches the expected value, while sequentially switching three test input voltages V1H, V1M and V1L (where V1L<Vth1L<V1M<Vth1H<V1H) as the input voltage V1.

In the BIST of the first embodiment (FIG. 8), as indicated by the upward arrows in the figure, only the expected value determination as to whether or not DIN1OVD=H is performed during the input period of the test input voltage V1H, and only the expected value determination as to whether or not DIN1UVD=H is performed during the input period of the test input voltage V1L. As a matter of course, if the logic levels of the detection signals DIN1OVD and DIN1UVD are properly changed in response to the change of the input voltage V1, no particular problem occurs even with such a BIST method.

However, when the detection signals DIN1OVD and DIN1UVD are fixed at a high level (i.e., logic level at the abnormal time), an erroneous BIST diagnosis result is obtained. In the following, such a problem will be described in detail.

Figure 11:
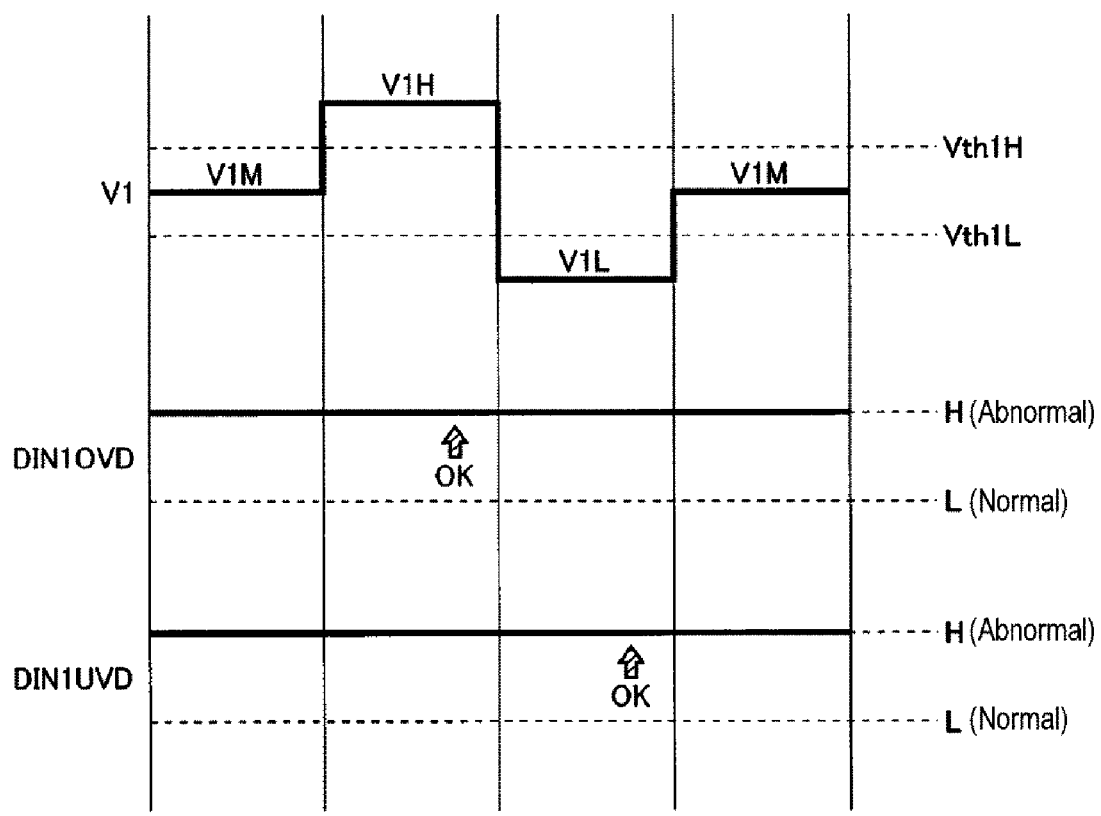
FIG. 11 is a timing chart showing another example of the diagnosis result in the first embodiment.

FIG. 11 is a timing chart showing another example of the diagnosis result (with H fixation) obtained by the BIST of the first embodiment (FIG. 8), in which, as in FIG. 10, the input voltage V1 and the detection signals DIN1OVD and DIN1UVD are depicted sequentially from the upper side.

In the example of this figure, both the detection signals DIN1OVD and DIN1UVD are fixed at a high level (i.e., logic level at the abnormal time). Therefore, if the expected value determination for each of the detection signals DIN1OVD and DIN1UVD is individually performed during the input period of each of the test input voltages V1H and V1L, each determination result is "OK". Therefore, the high-level fixation of the detection signals DIN1OVD and DIN1UVD may be overlooked. On the other hand, in the BIST of the second embodiment (FIG. 9), the above problem is solved. Hereinafter, description will be made on how to solve the problem.

Figure 12:
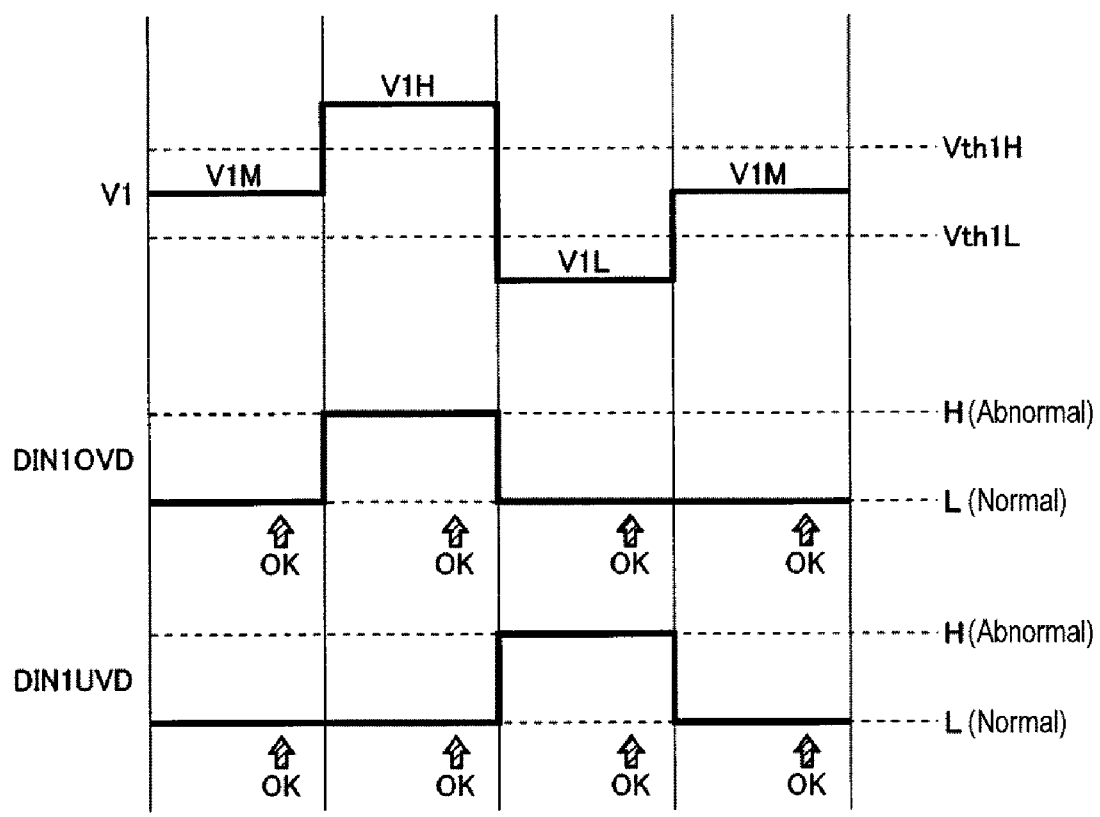
FIG. 12 is a timing chart showing an example of a diagnosis result in a second embodiment.

FIG. 12 is a timing chart showing another example of the diagnosis result (without H fixation) obtained by the BIST of the second embodiment, in which as in FIGS. 10 and 11, the input voltage V1 and the detection signals DIN1OVD and DIN1UVD are depicted sequentially from the upper side.

As indicated by the upward arrows in the figure, in the BIST of the second embodiment, the expected value determination of both the detection signals DIN1OVD and DIN1UVD is performed each time when the voltage value of the input voltage V1 is switched. More specifically, an expected value determination as to whether or not DIN1OVD=H and DIN1UVD=L is performed during the input period of the test input voltage V1H, and an expected value determination as to whether or not DIN1OVD=L and DIN1UVD=H is performed during the input period of the test input voltage V1L. In addition, an expected value determination as to whether or not DIN1OVD=DIN1UVD=L is performed during the input period of the test input voltage V1M.

By performing such an expected value determination, when the detection signals DIN1OVD and DIN1UVD are not fixed or set at a high level (i.e., logic level indicated at the time of abnormality), the result of the expected value determination becomes "OK" at all timings.

Figure 13:
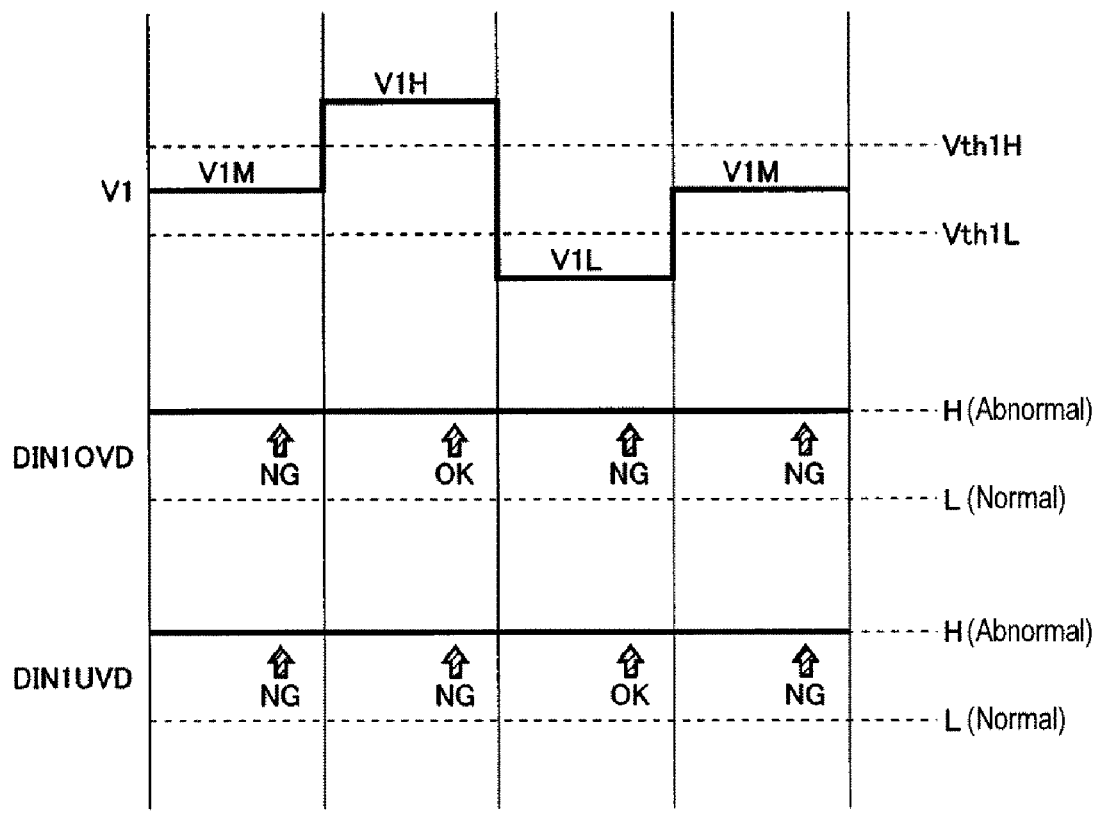
FIG. 13 is a timing chart showing another example of the diagnosis result in the second embodiment.

FIG. 13 is a timing chart showing another example of the diagnosis result (with H fixation) obtained by the BIST of the second embodiment, in which as in FIGS. 10 to 12, the input voltage V1 and the detection signals DIN1OVD and DIN1UVD are depicted sequentially from the upper side.

As shown in the figure, when the detection signals DIN1OVD and DIN1UVD are fixed or set at a high level (i.e., logic level indicated at the abnormal time), the expected value determination result becomes "NG" at the timing at which the detection signal DIN1OVD or DIN1UVD should originally be at a low level. Accordingly, the high-level fixation of the detection signals DIN1OVD and DIN1UVD is not overlooked. It is therefore possible to increase the failure detection rate of the monitoring IC 100.

<BIST Error Flag>

Figure 14:
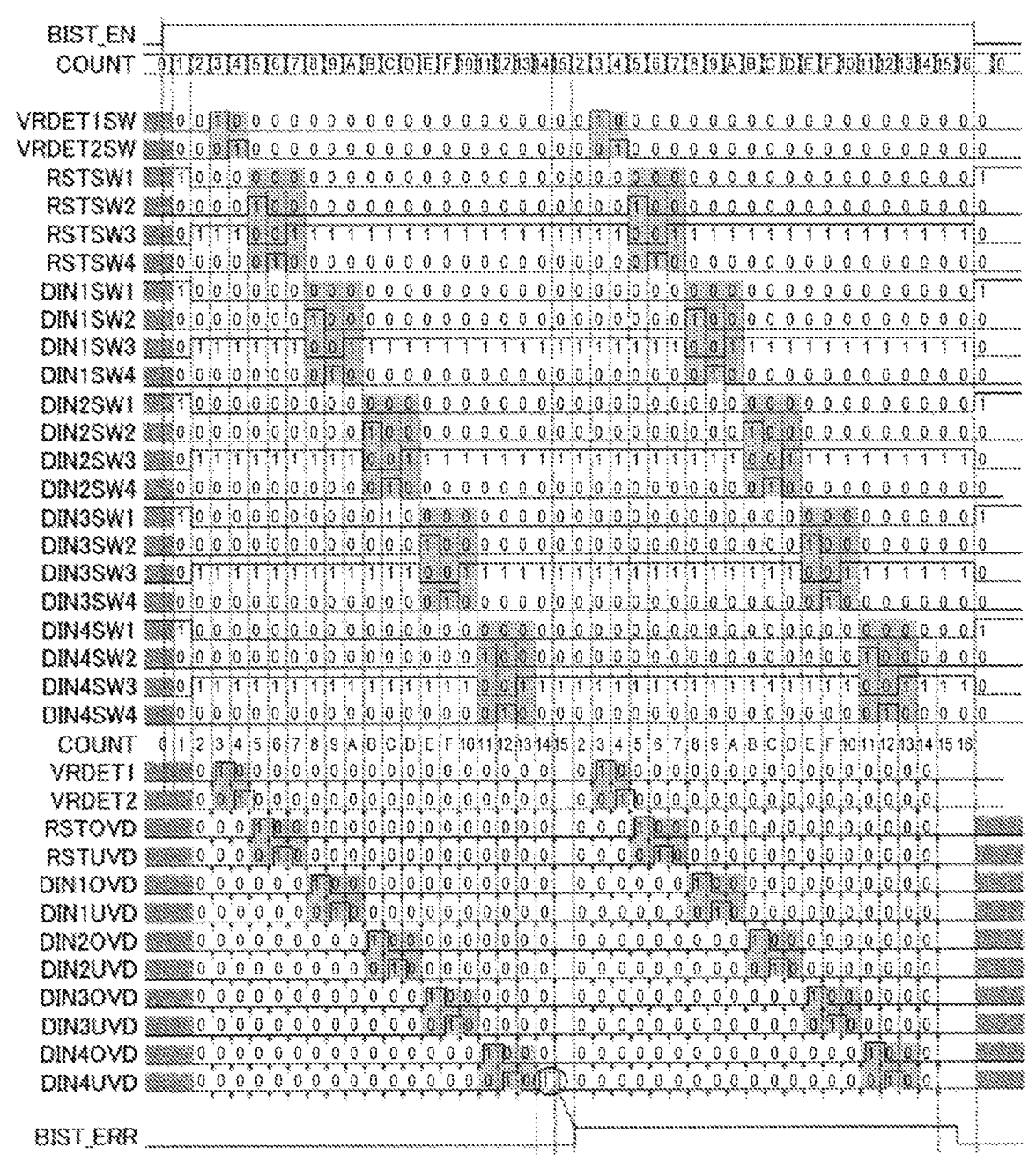

FIG. 14 is a timing chart showing an operation of generating a BIST error signal BIST_ERR. The BIST enable signal BIST_EN, the counter value COUNT, various control signals (VRDET1SW, VRDET2SW, RSTSW1 to RSTSW4, DIN1SW1 to DIN1SW4, DIN2SW1 to DIN2SW4, DIN3SW1 to DIN3SW4, and DIN4SW1 to DIN4SW4), the counter value COUNT (similar to the previous one), various detection signals (VRDET1, VRDET2, RSTOVD, RSTUVD, DIN1OVD, DIN1UVD, DIN2OVD, DIN2UVD, DIN3OVD, DIN3UVD, DIN4OVD, and DIN4UVD), and the BIST error signal BIST_ERR are depicted sequentially from the upper side.

In this figure, the BIST error signal BIST_ERR rises to a high level (see a circle mark in the figure) as the expected value determination for the detection signal DIN4UVD becomes "NG" in a first round BIST.

Furthermore, in this figure, a second round BIST is repeated in response to BIST_ERR=H. As a result, the BIST error signal BIST_ERR falls to a low level as the expected value determination of the detection signal DIN4UVD becomes "OK".

In this way, by repeating the BIST until BIST_ERR=L, a true diagnosis result can be obtained regardless of a transient external factor such as noise or the like. It is therefore possible to improve the noise immunity of the monitoring IC 100. This point is the same as described with reference to FIG. 6.

In addition, the self-diagnosis part 171 raises the BIST error signal BIST_ERROR to a high level when an error is detected in any one of the monitoring targets, and stores a BIST error flag in a register map for specifying the error location or indicating the error object.

FIG. 15 is a register map showing a storage area of the BIST error flag. As shown in this figure, in the resister map, the BIST error flags of all the detection signals (DIN1OVD, DIN2OVD, DIN3OVD, DIN4OVD, DIN1UVD, DIN2UVD, DIN3UVD, DIN4UVD, RSTOVD, RSTUVD, VRDET1, VRDET2), which become the monitoring targets of the BIST, are stored in individual addresses.

For example, in FIG. 14 described above, the expected value determination for the detection signal DIN4UVD is "NG". Therefore, the determination result is latched and then written in a predetermined address of the register map (address "D7" of the register name "ERR_BCHECK1") at a predetermined timing.

The BIST error flag can be arbitrarily read from the outside of the monitoring IC 100 by, for example, SPI (Serial Peripheral Interface) communication. With such a configuration, when an error is detected in the BIST, it is possible to specify the error location afterward. By applying the present disclosure to a Q & A method, it is also possible to increase the failure detection rate of the monitoring IC 100.

The aforementioned Q & A method will be supplementarily described. As a future development of the monitoring IC 100, for example, a system capable of removing a PGx pin and reading a BIST error flag via a communication interface such as an I$^2$C (Inter-Integrated Circuit) or an SPI (Serial Peripheral Interface) is conceivable.

In this case, when receiving a question signal (question: a command to read the BIST error flag written in the ∘∘ register) from the microcomputer 300 while performing a BIST or an ordinary operation, the monitoring IC 100 transmits an answer signal (answer: BIST error flag requested to be read) responding to the question signal.

By periodically performing such Q & A, it is possible for the microcomputer 300 to freely read out where an abnormality is in the monitoring IC 100.

<WDEN-WDOUT>

FIG. 16 is a diagram showing a state in which the unidirectional communication of the watchdog enable signal WDEN is performed between the monitoring IC 100 and the microcomputer 300. In this case, when the watchdog enable signal WDEN generates a power supply short-circuit (i.e., short-circuit to a power supply terminal or a high-potential terminal equivalent thereto), a ground terminal short-circuit (i.e., short-circuit to a ground terminal or a low-potential terminal equivalent thereto), an opening abnormality, and the like, the microcomputer 300 cannot recognize these abnormalities.

Therefore, even though the microcomputer 300 intends to operate the monitoring function (in this case, the watchdog timer 173) of the monitoring IC 100, in plural embodiments, the monitoring function may not be operated properly, whereby the failure detection rate of the monitoring IC 100 may decrease. In the following, a novel configuration adopted in the monitoring IC 100 in order to solve such a problem is proposed.

FIG. 17 is a diagram showing a state in which the bidirectional communication of a watchdog enable signal WDEN and a watchdog output signal WDOUT is performed between the monitoring IC 100 and the microcomputer 300.

That is, the monitoring IC 100 includes a watchdog timer 173 for monitoring the frequency of a watchdog input signal WDIN, an input terminal (i.e., WDEN pin) to which a watchdog enable signal WDEN for switching the validity and invalidity of the watchdog timer 173 is inputted, and an output terminal (i.e., WDOUT pin) for outputting a watchdog output signal WDOUT (i.e., corresponding to a status signal) for notifying the microcomputer 300 of the validity and invalidity of the watchdog timer 173.

By adopting such a configuration, it is possible for the microcomputer 300 to confirm whether or not the operation control of the watchdog timer 173 can be correctly performed using the watchdog enable signal WDEN. Therefore, it is possible to prevent the monitoring missing (i.e., a state in which the watchdog timer 173 does not operate contrary to the intention) at the time of occurrence of an abnormality of the WDEN pin.

Figure 18:
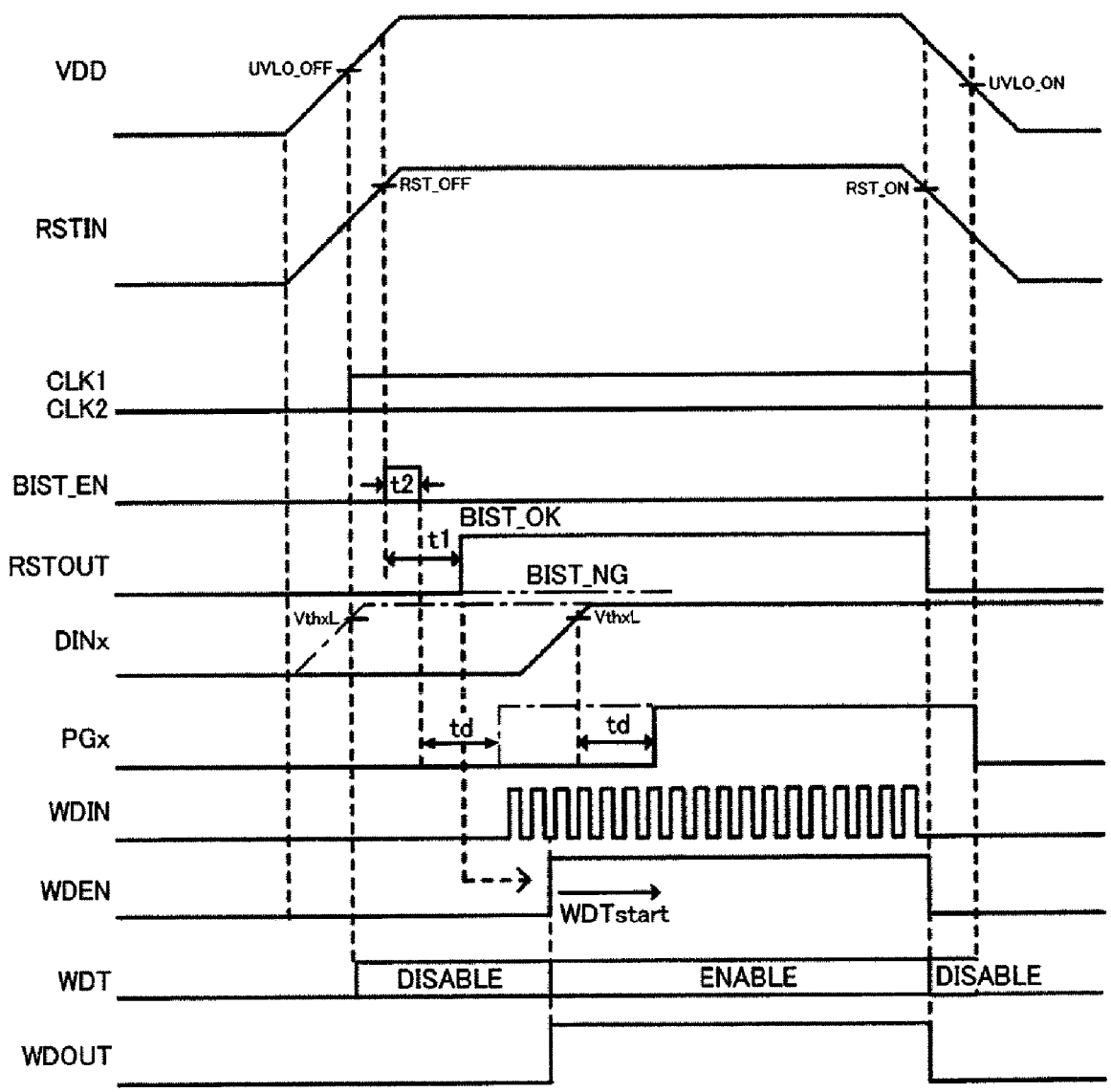
FIG. 18 is a timing chart showing an operation of generating a status signal.

FIG. 18 is a timing chart showing an operation of generating a watchdog output signal WDOUT (i.e., status signal). The power supply voltage VDD, the reset input signal RSTIN, the clock signals CLK1 and CLK2, the BIST enable signal BIST_EN, the reset output signal RSTOUT, the monitoring target voltage DINx, the power good signal PGx, the watchdog input signal WDIN, the watchdog enable signal WDEN, the operation state of the watchdog timer 173 and the watchdog output signal WDOUT are depicted sequentially from the upper side.

After the power supply is turned on by the power management IC 200, if the power supply voltage VDD rises to a low voltage abnormality release value UVLO_OFF, an operation of generating each of the clock signals CLK1 and CLK2 is started. However, at this time point, the watchdog enable signal WDEN is maintained at a low level. Therefore, the watchdog timer 173 is disabled. In addition, the watchdog output signal WDOUT is maintained at a low level just like the watchdog enable signal WDEN accepted by the monitoring IC 100.

Thereafter, if the reset input signal RSTIN (i.e., the divided voltage of the power supply voltage VDD) rises to a reset release value RST_OFF, the BIST enable signal BIST_EN rises to a high level and the BIST is started.

If the diagnosis result of the BIST is "OK", the reset output signal RSTOUT rises to a high level (see the solid line of RSTOUT) after the reset release waiting time t1 elapses. On the other hand, if the diagnosis result of the BIST is "NG", the BIST is repeated (see the two-dot chain line of RSTOUT) while the reset output signal RSTOUT is maintained at a low level.

When the monitoring target voltage DINx rises to the lower threshold voltage VthxL after the reset output signal RSTOUT is raised to a high level, the power good signal PGx is raised to a high level (see the solid lines of DINx and PGx) at the timing when a predetermined delay time td has elapsed from the point of time at which DINx=VthxL.

On the other hand, if the monitoring target voltage DINx rises to the lower threshold voltage VthxL before the reset output signal RSTOUT is raised to a high level, the power good signal PGx is raised to a high level (see the one-dot chain lines of DINx and PGx) at the timing when a predetermined delay time td has elapsed from the point of time at which the BIST normally comes to an end.

In addition, when the reset output signal RSTOUT rises to a high level, the reset of the microcomputer 300 is released. Accordingly, thereafter, the watchdog input signal WDIN (i.e., the monitoring target of the watchdog timer 173) is inputted from the microcomputer 300 to the monitoring IC 100.

Furthermore, after the output of the watchdog input signal WDIN is started, the microcomputer 300 raises the watchdog enable signal WDEN to a high level. As a result, the watchdog timer 173 shifts from a disabled state to an enabled state (i.e., a state in which the frequency of the watchdog input signal WDIN is monitored).

At this time, if there is no abnormality (such as a power supply short-circuit, a ground terminal short-circuit, an opening abnormality, etc.) at the WDEN pin, the watchdog output signal WDOUT is raised to a high level just like the watchdog enable signal WDEN accepted by the monitoring IC 100.

Therefore, by determining the match/mismatch of the watchdog enable signal WDEN outputted to the monitoring IC 100 and the watchdog output signal WDOUT inputted from the monitoring IC 100, the microcomputer 300 can confirm whether or not the enable control of the watchdog timer 173 can be correctly performed using the watchdog enable signal WDEN (details of which will be described later).

When the reset input signal RSTIN is decreased to the reset detection value RST_ON, the reset output signal RSTOUT falls to a low level. As a result, the microcomputer 300 is reset and, therefore, the output of the watchdog input signal WDIN is stopped. In addition, the watchdog enable signal WDEN falls to a low level and, therefore, the watchdog timer 173 is disabled. At this time, the watchdog output signal WDOUT also falls to a low level.

Thereafter, when the power supply voltage VDD is decreased to the low voltage abnormality detection value UVLO_ON, the operation of generating each of the clock signals CLK1 and CLK2 is stopped, and the power good signal PGx falls to a low level.

FIG. 19 is a correlation diagram showing the watchdog enable signal WDEN, the watchdog output signal WDOUT (i.e., status signal) and the terminal state of the WDEN pin.

The logic level of the watchdog enable signal WDEN in this figure is not the actual logic level inputted to the monitoring IC 100 but is the original logic level set inside the microcomputer 300. On the other hand, the logic level of the watchdog output signal WDOUT indicates the actual logic level inputted to the microcomputer 300. In this case, for simplicity of explanation, no consideration is given to the abnormality (the power supply short-circuit, the ground terminal short-circuit, the opening abnormality, etc.) of the watchdog output signal WDOUT.

If WDOUT=H is inputted to the microcomputer 300 while outputting WDEN=H, it can be confirmed that the watchdog timer 173 is in an enabled state as intended by the microcomputer 300.

Likewise, if WDOUT=L is inputted to the microcomputer 300 while outputting WDEN=L, it can be confirmed that the watchdog timer 173 is in a disabled state as intended by the microcomputer 300.

On the other hand, if WDOUT=L is inputted to the microcomputer 300 despite the fact that the microcomputer 300 is outputting WDEN=H, it can be confirmed that the WDEN pin has an abnormality such as a ground terminal short-circuit or the like and the watchdog timer 173 is in a disabled state contrary to the intention of the microcomputer 300.

In addition, if WDOUT=H is inputted to the microcomputer 300 despite the fact that the microcomputer 300 is outputting WDEN=L, it can be confirmed that the WDEN pin has an abnormality such as a power supply short-circuit or the like and the watchdog timer 173 is in an enabled state contrary to the intention of the microcomputer 300.

<Clock Detection Part>

Figure 20:
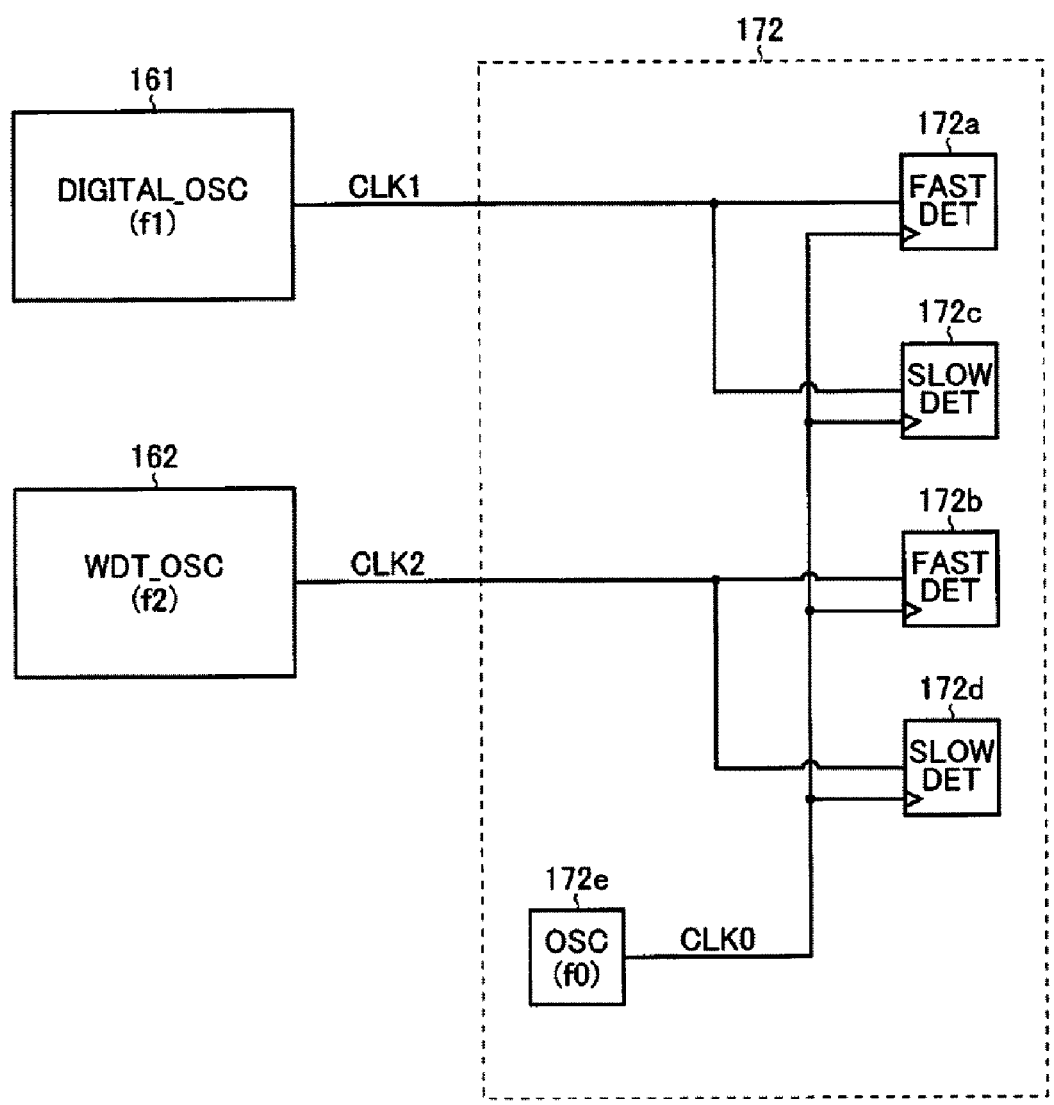
FIG. 20 is a block diagram showing a first configuration example of a clock detection part.

FIG. 20 is a block diagram showing a first configuration example of the clock detection part 172. The clock detection part 172 of the present configuration example includes high frequency abnormality detection parts 172a and 172b, low frequency abnormality detection parts 172c and 172d, and an oscillator 172e.

The high frequency abnormality detection part 172a detects a high frequency abnormality of the clock signal CLK1 (oscillation frequency f1) using a clock signal CLK0 (oscillation frequency f0).

The high frequency abnormality detection part 172b detects a high frequency abnormality of the clock signal CLK2 (oscillation frequency f2) using the clock signal CLK0.

The low frequency abnormality detection part 172c detects a low frequency abnormality of the clock signal CLK1 using the clock signal CLK0.

The low frequency abnormality detection part 172d detects a low frequency abnormality of the clock signal CLK2 using the clock signal CLK0.

The oscillator 172e generates a clock signal CLK0 having an oscillation frequency f0 (>f1>f2) higher than the oscillation frequencies f1 and f2 of the clock signals CLK1 and CLK2.

Figure 21:
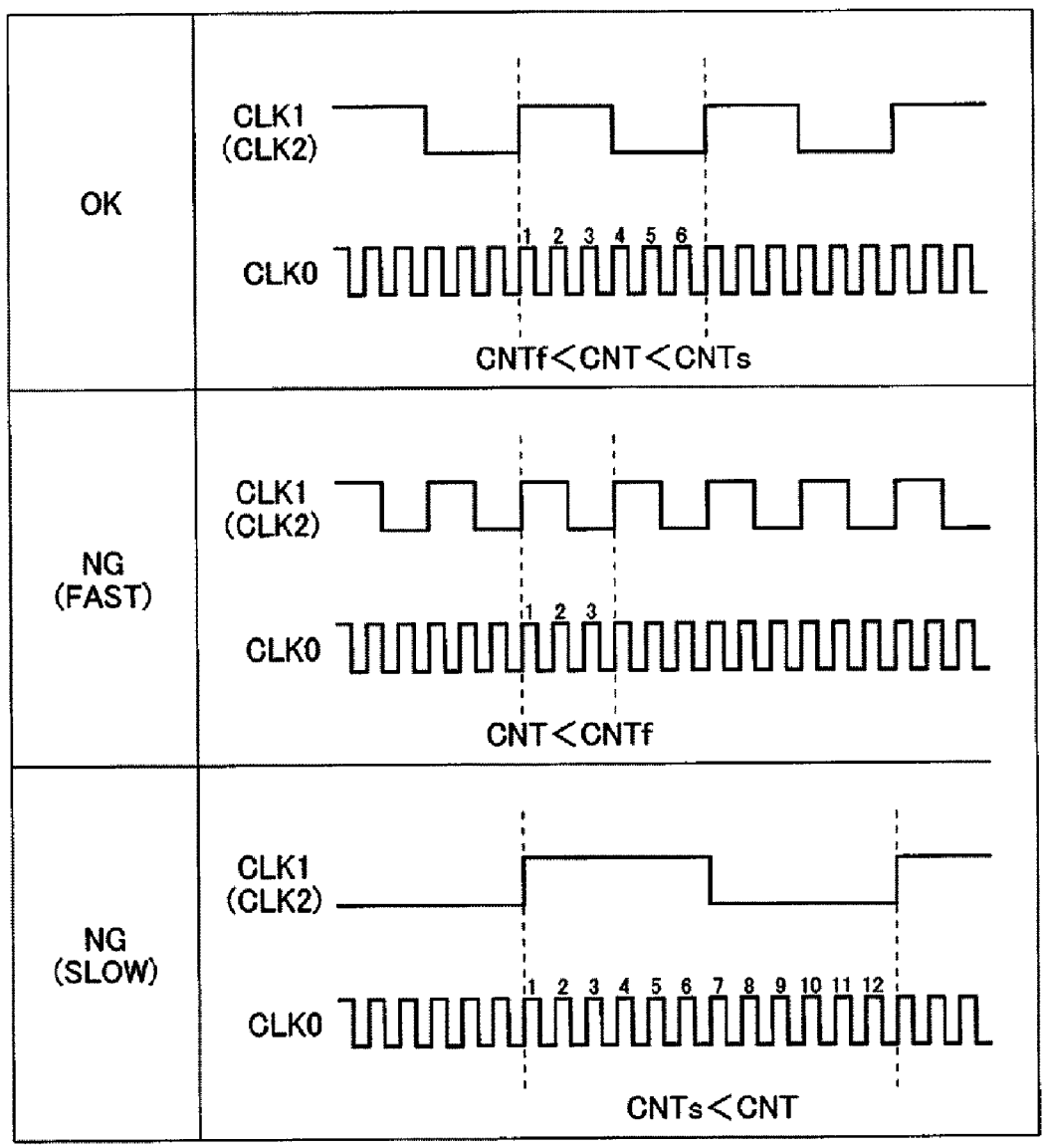
FIG. 21 is a diagram showing a determination operation of the clock detection part.

FIG. 21 is a diagram showing an example of a determination operation by the clock detection part 172 of the first configuration example. In the following description, the number of pulses of the clock signal CLK0 during one period of the clock signal CLK1 (or CLK2) is denoted by CNT, and the high frequency abnormality detection value and the low frequency abnormality detection value are denoted by CNTf and CNTs (where CNTf<CNTs), respectively.

As shown in the upper stage of this figure, when CNTf<CNT<CNTs, it is determined that the oscillation frequency f1 of the clock signal CLK1 (or the oscillation frequency f2 of the clock signal CLK2) is normal.

On the other hand, as shown in the middle stage of this figure, when CNT<CNTf, it is determined that the oscillation frequency f1 of the clock signal CLK1 (or the oscillation frequency f2 of the clock signal CLK2) is a high frequency abnormality.

As shown in the lower stage of the figure, when CNTs<CNT, it is determined that the oscillation frequency f1 of the clock signal CLK1 (or the oscillation frequency f2 of the clock signal CLK2) is a low frequency abnormality.

As described above, in order to monitor the oscillation frequencies f1 and f2 of the clock signals CLK1 and CLK2, it is necessary for the clock detection part 172 of the first configuration example to prepare the clock signal CLK0 having a higher oscillation frequency f0 (>f1>f2). Furthermore, in order to increase the detection accuracy of the clock detection part 172, it is necessary to ensure that the oscillation frequency f0 of the clock signal CLK0 is accurate. Thus, the circuit size increases. In the following, a clock detection part 172 of a second configuration example capable of solving such a problem is proposed.

Figure 22:
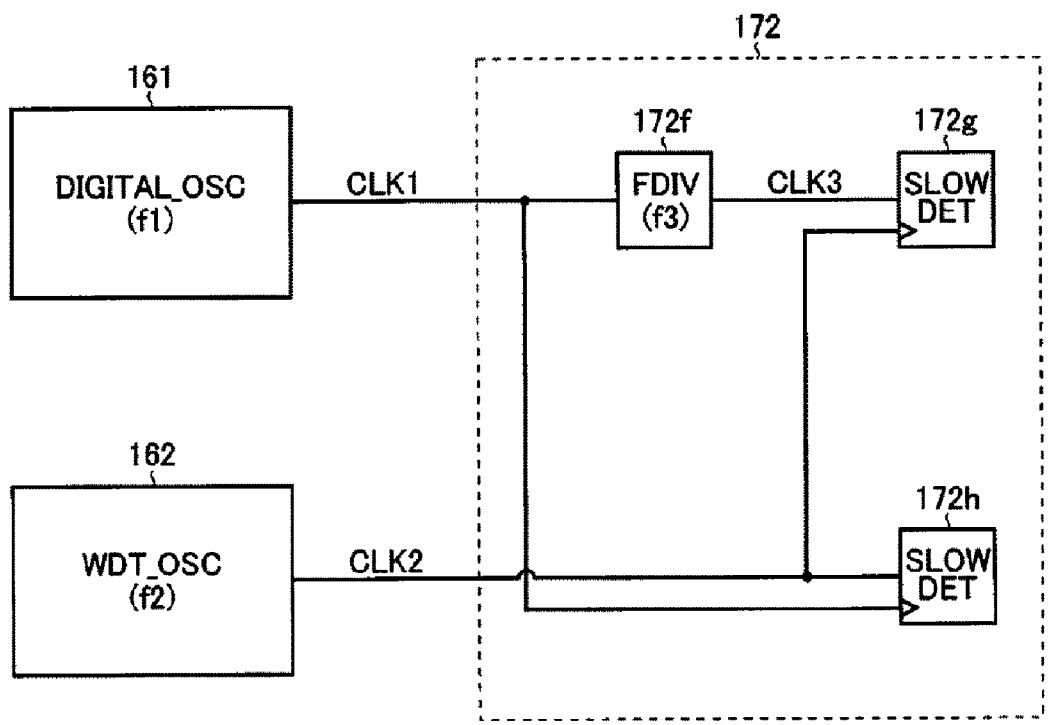
FIG. 22 is a block diagram showing a second configuration example of the clock detection part.

FIG. 22 is a block diagram showing a second configuration example of the clock detection part 172. As shown in the figure, the clock detection part 172 of the present configuration example includes a frequency divider 172f and low frequency abnormality detection parts 172g and 172h.

The frequency divider 172f divides the frequency of the clock signal CLK1 having the oscillation frequency f1 to generate a clock signal CLK3 having an oscillation frequency f3 (<f2).

The low frequency abnormality detection part 172g detects a low frequency abnormality of the clock signal CLK3 using the clock signal CLK2 having the oscillation frequency f2.

The low frequency abnormality detection part 172h detects a low frequency abnormality of the clock signal CLK2 using the clock signal CLK1.

As described above, in the clock detection part 172 of the present configuration example, the introduction of the frequency divider 172f makes it possible to realize frequency monitoring between the clock signals CLK1 and CLK2 without having to prepare the clock signal CLK0 having a high frequency (see FIG. 20). Hereinafter, the determination operation of each of the low frequency abnormality detection parts 172g and 172h will be individually and concretely described.

Figure 23:
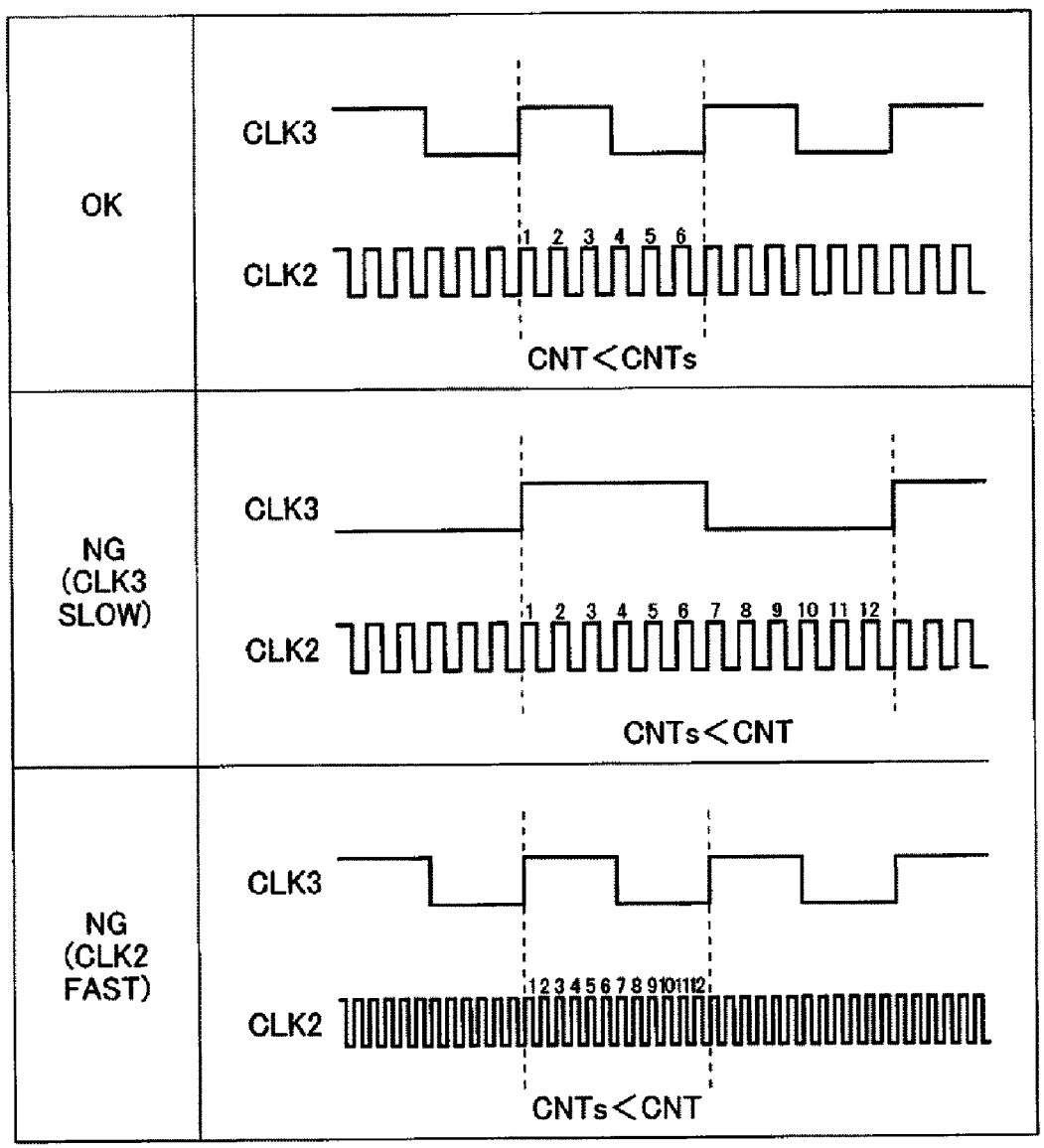
FIG. 23 is a diagram showing a determination operation of a first low frequency abnormality detection part.

FIG. 23 is a diagram showing a determination operation of the low frequency abnormality detection part 172g. In the following description, the number of pulses of the clock signal CLK2 during one period of the clock signal CLK3 is denoted by CNT and the low frequency abnormality detection value is denoted by CNTs.

As shown in the upper stage of the figure, when CNT<CNTs, it is determined that the clock signals CLK2 and CLK3 (and ultimately the clock signal CLK1) are normal.

On the other hand, as shown in the middle and lower stages of this figure, when CNTs<CNT, it is determined that the low frequency abnormality of the clock signal CLK3 (and ultimately the clock signal CLK1) or the high frequency abnormality of the clock signal CLK2 has occurred.

In this manner, the low frequency abnormality detection part 172g can detect the low frequency abnormality of the monitored-side clock signal CLK3 (and ultimately the clock signal CLK1) and, conversely, can also detect the high frequency abnormality of the monitoring-side clock signal CLK2. Therefore, it is possible to contribute to the reduction in the circuit size of the clock detection part 172.

Figure 24:
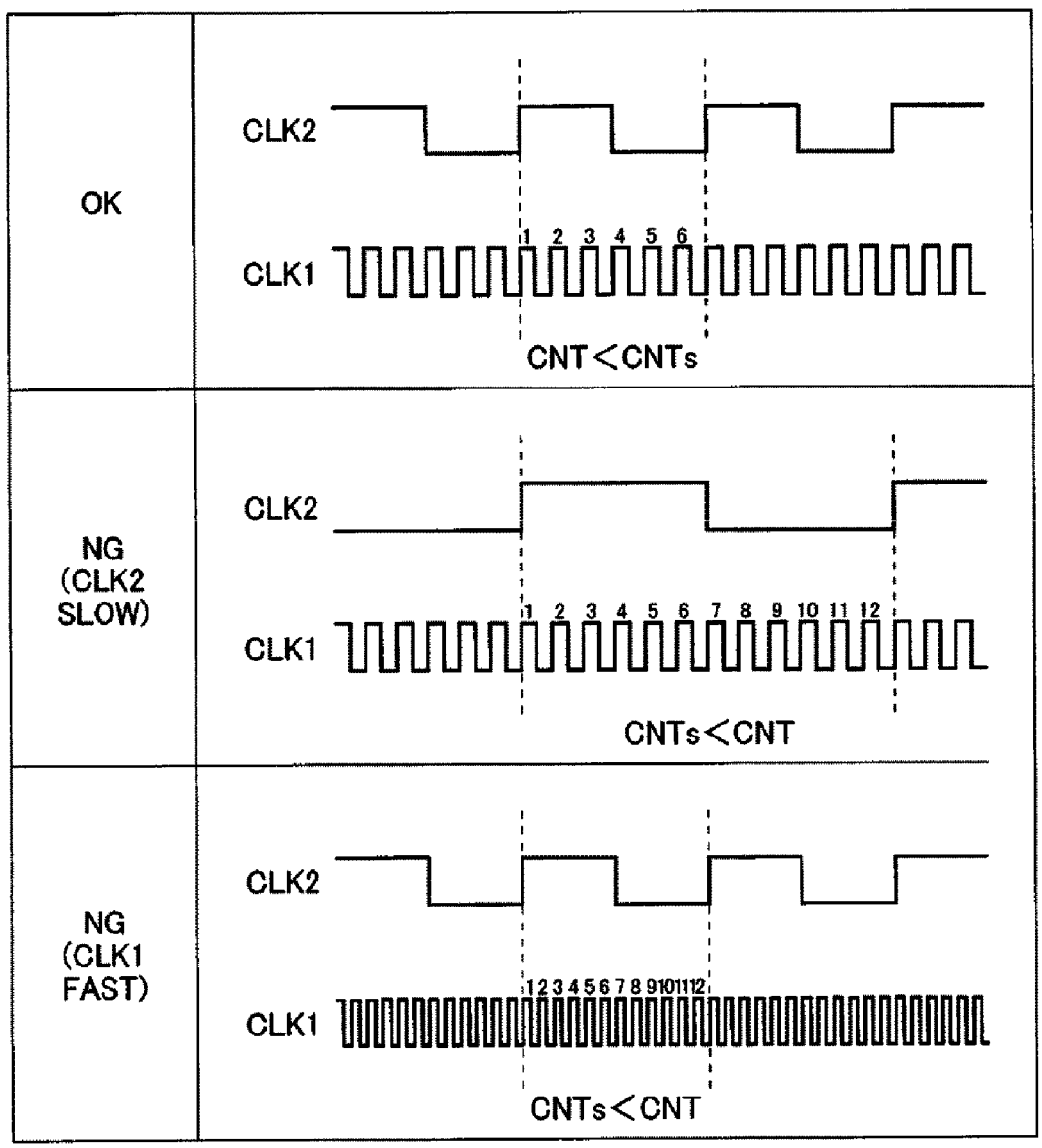
FIG. 24 is a diagram showing a determination operation of a second low frequency abnormality detection part.

FIG. 24 is a diagram showing a determination operation of the low frequency abnormality detection part 172h. In the following description, the number of pulses of the clock signal CLK1 during one period of the clock signal CLK2 is denoted by CNT and the low frequency abnormality detection value is denoted by CNTs.

As shown in the upper stage of this figure, when CNT<CNTs, it is determined that the clock signals CLK1 and CLK2 are normal.

On the other hand, as shown in the middle and lower stages of this figure, when CNTs<CNT, it is determined that the low frequency abnormality of the clock signal CLK2 or the high frequency abnormality of the clock signal CLK1 has occurred.

In this manner, the low frequency abnormality detection part 172h can detect the low frequency abnormality of the monitored-side clock signal CLK2 and, conversely, can also detect the high frequency abnormality of the monitoring-side clock signal CLK1. Therefore, it is possible to contribute to the reduction in the circuit size of the clock detection part 172.

<Digital Processing Part>

Figure 25:
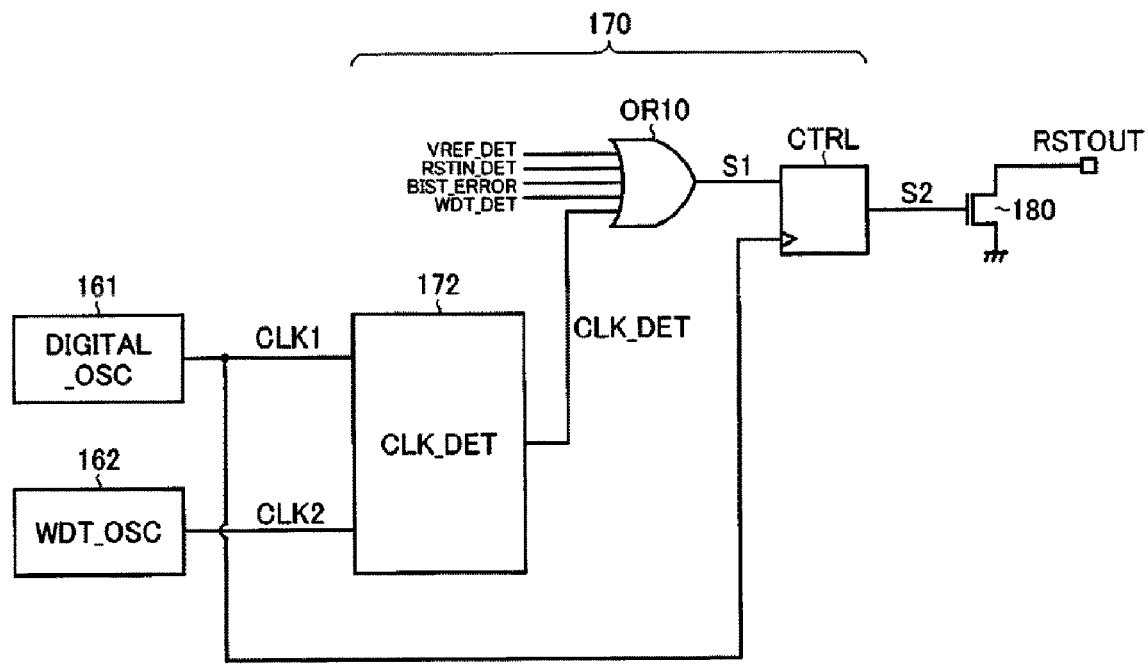
FIG. 25 is a diagram showing a first configuration example of a digital processing part.

FIG. 25 is a diagram showing a first configuration example of the digital processing part 170 (only the main part configuration relating to the reset output operation). The digital processing part 170 of the present configuration example includes a reset control part CTRL as well as the clock detection part 172 and the OR gate OR10 described above.

The reset control part CTRL latches an OR signal S1 of the OR gate OR10 in synchronization with the clock signal CLK1 and outputs a latched output signal S2 (i.e., the reset output detection signal RSTOUT_DET or the gate signal G0 described above) to the gate of the transistor 180. The reset control part CTRL has a timer function for counting the reset release waiting time t1 and the like. In FIG. 2 described above, the reset control part CTRL is not shown. In plural embodiments, as shown in FIG. 25, the reset control part CTRL may be provided between the OR gate OR10 and the transistor 180.

However, in the digital processing part 170 of the present configuration example, if an abnormality occurs in the oscillator 161 and the clock signal CLK1 stops, the reset control part CTRL cannot perform a reset output operation and the reset output signal RSTOUT may not correctly fall to a low level. In the following, a digital processing part 170 of a second configuration example capable of solving such a problem is proposed.

Figure 26:
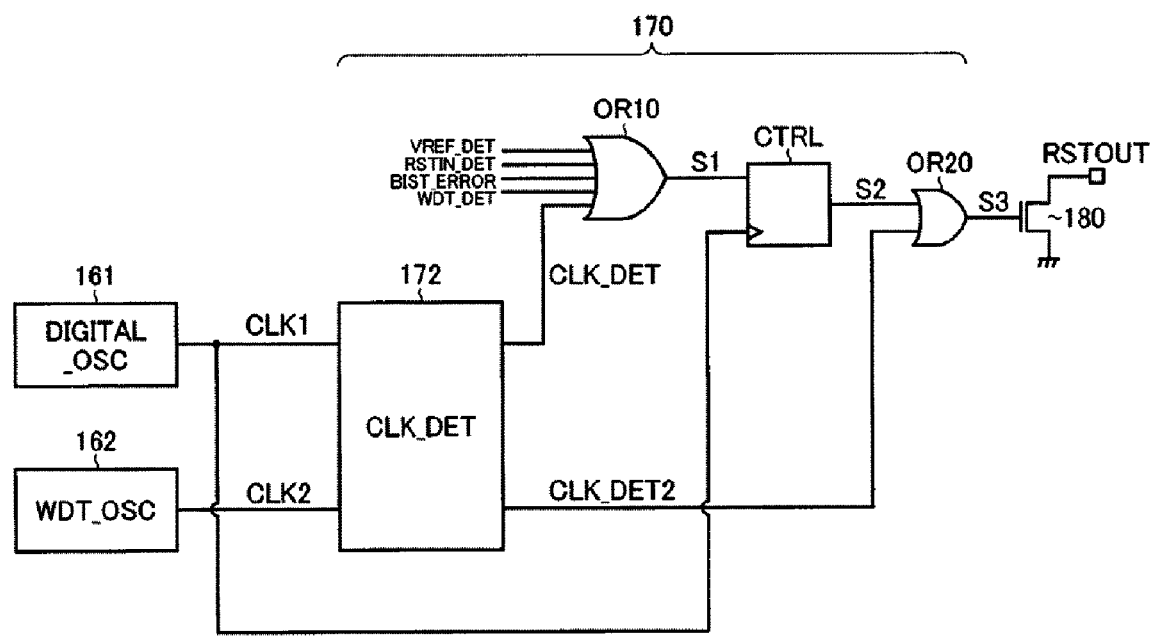
FIG. 26 is a diagram showing a second configuration example of the digital processing part.

FIG. 26 is a diagram showing a second configuration example of the digital processing part 170. The digital processing part 170 of the present configuration example is based on the first configuration example (FIG. 25) and further includes an OR gate OR20. In addition, the clock detection part 172 generates not only a clock detection signal CLK_DET but also a clock stop signal CLK_DET2.

As described above, the clock detection signal CLK_DET goes to a high level when the frequency abnormality of each of the clock signals CLK1 and CLK2 is detected. On the other hand, the clock stop signal CLK_DET2 goes to a high level when an abnormal stop of the clock signal CLK1 (or a low frequency abnormality equivalent thereto) is detected.

The OR gate OR20 performs a logical sum operation for the latch output signal S2 inputted from the clock control part CTRL and the clock stop signal CLK_DET2 inputted from the clock detection part 172, and outputs an OR signal S3 (i.e., the reset output detection signal RSTOUT_DET or the gate signal G0 described above) to the gate of the transistor 180.

When the clock stop signal CLK_DET2 is at a low level, the latch output signal S2 is outputted as an OR signal S3. On the other hand, when the clock stop signal CLK_DET2 is at the high level, the OR signal S3 is fixed at a high level without depending on the logic level of the latch output signal S2.

That is, when the abnormal stop of the clock signal CLK1 is detected, the reset output signal RSTOUT is fixed at a high level (i.e., the logic level at the time of abnormality detection) by ignoring the latch output signal S2 of the reset control part CTRL. In other words, the reset output signal RSTOUT is directly controlled using the clock stop signal CLK_DET2.

With such a configuration, even when the clock signal CLK1 abnormally stops and the reset control part CTRL cannot perform the reset output operation, the reset output signal RSTOUT can reliably be set to a low level, which makes it possible to safely stop the electronic device 1.

Figure 27:
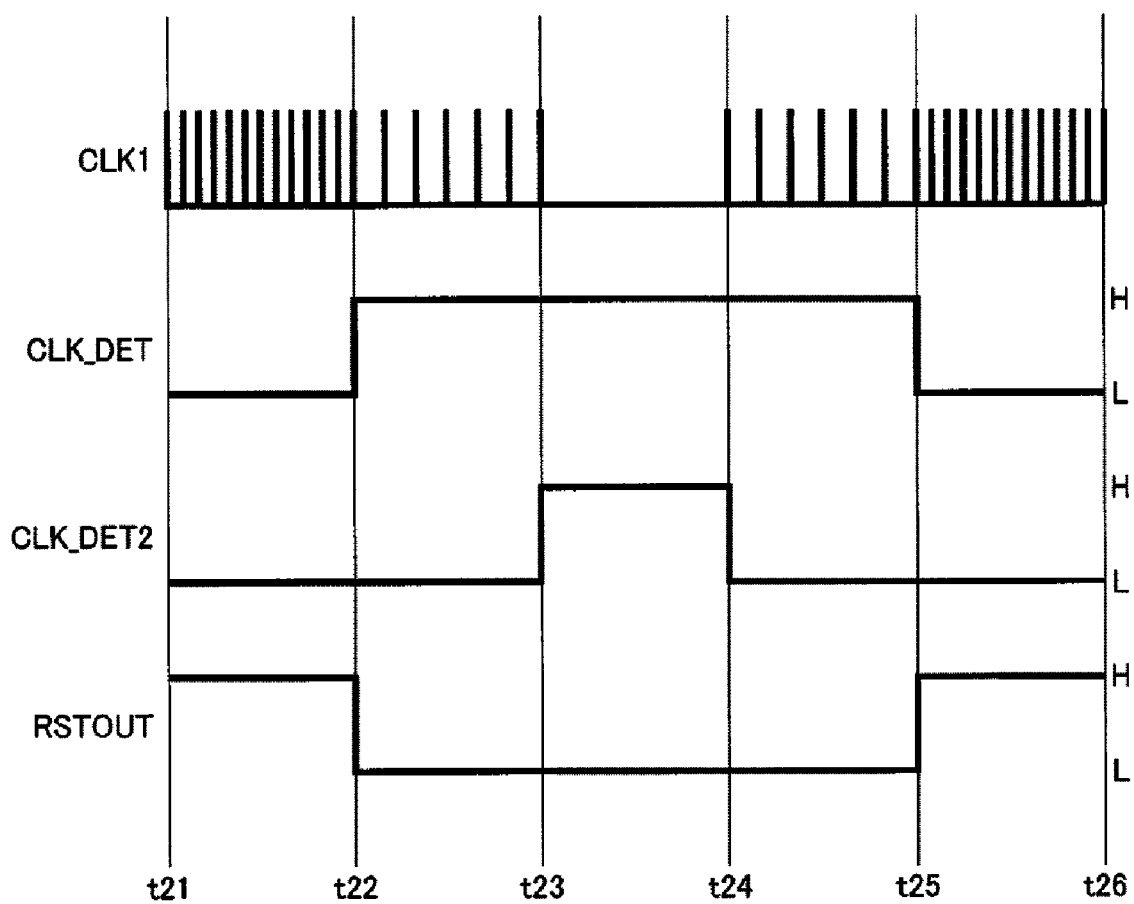
FIG. 27 is a timing chart showing an example of a reset output operation.

FIG. 27 is a timing chart showing an example of a reset output operation in the digital processing part 170 of the second configuration example (FIG. 26). The clock signal CLK1, the clock detection signal CLK_DET, the clock stop signal CLK_DET2 and the reset output signal RSTOUT are depicted sequentially from the upper side.

Since the clock signal CLK1 is normal at times t21 to t22, both the clock detection signal CLK_DET and the clock stop signal CLK_DET2 are at a low level. Therefore, the reset output signal RSTOUT goes to a high level (i.e., logic level at the time of reset release) as long as no other abnormality is detected.

At times t22 to t23, the clock detection signal CLK_DET goes to a high level as the low frequency abnormality of the clock signal CLK1 is detected. However, the clock signal CLK1 is not completely stopped. Therefore, the reset output operation of the reset control part CTRL is valid. Accordingly, the reset output signal RSTOUT falls to a low level (i.e., logic level at the time of reset) in response to the latch output signal S2 (i.e., H) outputted from the reset control part CTRL.

At times t23 to t24, the clock stop signal CLK_DET2 goes to a high level as the abnormal stop of the clock signal CLK1 is detected. In this state, the reset control part CTRL cannot perform the reset control operation. Accordingly, the reset output signal RSTOUT is fixed at a low level in response to the clock stop signal CLK_DET2 (i.e., H) outputted from the clock detection part 172.

At times t24 to t25, the abnormal stop of the clock signal CLK1 has been resolved, but the low frequency abnormality has been detected. Therefore, the clock detection signal CLK_DET is at a high level. However, the clock signal CLK1 is not completely stopped. Therefore, the reset output operation of the reset control part CTRL is valid. Thus, similar to the previous times t22 to t23, the reset output signal RSTOUT is continuously maintained at the low level in response to the latch output signal S2 (i.e., H) outputted from the reset control part CTRL.

At times t25 to t26, the clock signal CLK1 has returned to a normal state. Therefore, both the clock detection signal CLK_DET and the clock stop signal CLK_DET2 are at a low level. Accordingly, the reset output signal RSTOUT rises to a high level (i.e., logic level at the time of reset release) as long as no other abnormality is detected.

As described above, according to the digital processing part 170 of the second configuration example, even if the oscillation frequency f1 of the clock signal CLK1 fluctuates, it is possible to perform an appropriate reset output operation depending on the oscillation state of the clock signal CLK1.

<Application to Motor Vehicle>

Figure 28:
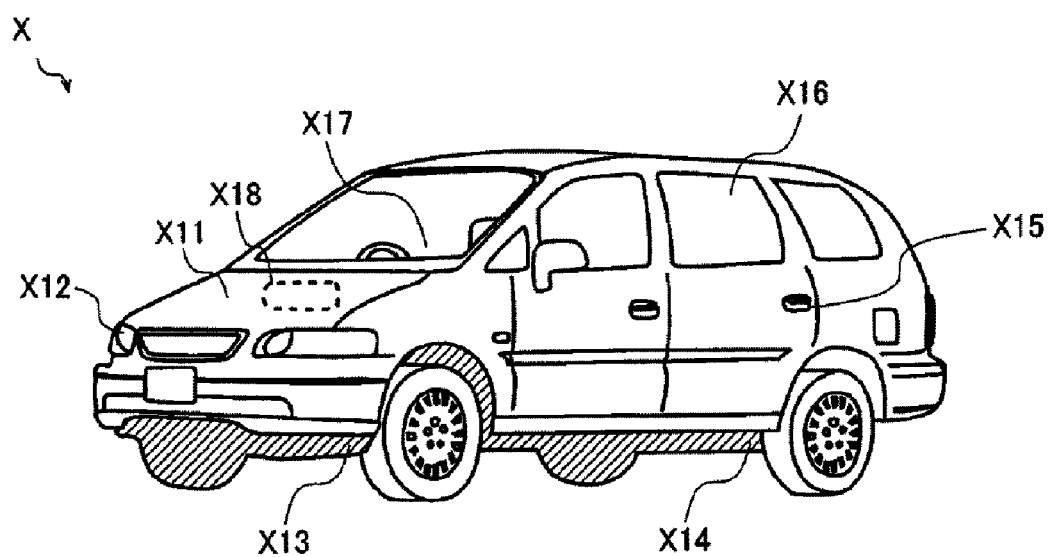
FIG. 28 is an external view of a motor vehicle.

FIG. 28 is an external view showing a configuration example of a motor vehicle X. The motor vehicle X of the present configuration example is equipped with various electronic devices (in-vehicle devices) X11 to X18 that operate by receiving power supply from a battery. For the sake of convenience in illustration, the mounting positions of the electronic devices X11 to X18 in this figure may be different from the actual positions.

The electronic device X11 is an engine control unit that performs engine-related control (injection control, electronic throttle control, idling control, oxygen sensor heater control, auto cruise control, etc.).

The electronic device X12 is a lamp control unit that performs on/off control of a HID (high intensity discharged lamp) or a DRL (daytime running lamp).

The electronic device X13 is a transmission control unit that performs transmission-related control.

The electronic device X14 is a braking unit that performs control related to the motion of the motor vehicle X (ABS [anti-lock brake system] control, EPS [electric power steering] control, electronic suspension control, etc.).

The electronic device X15 is a security control unit that performs drive control of a door lock, a security alarm or the like.

The electronic device X16 is standard equipment or a manufacturer option item such as a wiper, an electric door mirror, a power window, a damper (shock absorber), an electric sunroof, an electric seat or the like. The electronic device X16 is an electronic device incorporated in the motor vehicle X at the factory shipment stage.

The electronic device X17 is an electronic device that is arbitrarily mounted on the motor vehicle X as a user option item such as an in-vehicle A/V (audio/visual) device, a car navigation system, an electronic toll collection system (ETC) or the like.

The electronic device X18 is an electronic device including a high-pressure-resistant motor such as an in-vehicle blower, an oil pump, a water pump, a battery cooling fan or the like.

The monitoring IC 100 described above can be incorporated in any one of the electronic devices X11 to X18.

<Other Modifications>

In the above-described embodiments, the monitoring IC mounted in the in-vehicle device has been taken as an example. However, the application target thereof is not limited thereto. The monitoring IC can be widely applied to all electronic devices.

Apart from the above-described embodiments, various technical features disclosed in this specification can be variously modified without departing from the gist of the technical creation thereof. That is, it is to be noted that the above-described embodiment are exemplary in all respects and are not limitative. The technical scope of the present disclosure is not limited to the above-described embodiments. It is to be understood that the technical scope of the present disclosure encompasses all changes falling within the meaning and range equivalent to the claims.

The present disclosure can be used for, e.g., an in-vehicle millimeter wave radar module, an in-vehicle camera or an in-vehicle power supply module.

According to the present disclosure in some embodiments, it is possible to provide a monitoring device having a high failure detection rate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A monitoring device, comprising:
a monitoring part configured to detect an abnormality of a monitoring target, and including a first monitoring mechanism configured to detect whether or not an input signal is higher than a first threshold value;
a self-diagnosis part configured to diagnose whether or not the first monitoring mechanism operates abnormally during a period from a startup time point of a power supply to an elapse time point at which a reset release waiting time elapses; and
a reset control part configured to release a reset of a reset output signal on or after the elapse time point,
wherein the self-diagnosis part is further configured to, while the input signal is switched between a first test signal and a second test signal, determine whether or not an output signal of the first monitoring mechanism matches a value that is predetermined according to the input signal, and
wherein the first test signal is pre-set to be higher than the first threshold value and the second test signal is pre-set to be lower than the first threshold value.

2. The monitoring device of claim 1, wherein the self-diagnosis part is further configured to repeatedly diagnose the first monitoring mechanism until the self-diagnosis part determines that the first monitoring mechanism operates normally.

3. The monitoring device of claim 1, wherein the monitoring part includes a plurality of monitoring mechanisms in which the first monitoring mechanism is included, and
wherein, while sequentially switching a diagnosis target, to which a test signal is inputted, from among the plurality of monitoring mechanisms, the self-diagnosis part is further configured to determine whether or not an output signal from a monitoring mechanism serving as the diagnosis target matches a first expected value and also to determine whether or not an output signal from each of the plurality of monitoring mechanisms other than the monitoring mechanism serving as the diagnosis target matches a second expected value.

4. The monitoring device of claim 1, wherein the first monitoring mechanism serves an upper comparator, and
wherein the monitoring part further includes a second monitoring mechanism serving as a lower comparator and configured to detect whether the input signal is lower than a second threshold value, and
wherein the self-diagnosis part is further configured to, while the input signal is sequentially switched among the first test signal, the second test signal, and a third test signal, determine whether or not an output signal of each of the first monitoring mechanism and the second monitoring mechanism matches the predetermined value,
wherein the first test signal is pre-set to be higher than the first threshold value, the second test signal is pre-set to be lower than the first threshold value and higher than the second threshold value, and the third test signal is pre-set lower than the second threshold value.

5. The monitoring device of claim 1, wherein the self-diagnosis part is further configured to store an error flag for indicating an object in which an error occurs.

6. The monitoring device of claim 1, further comprising:
an input terminal to which an enable signal for switching between validity and invalidity of the monitoring part is inputted; and
an output terminal configured to output a status signal for notifying validity or invalidity of the monitoring part.

7. The monitoring device of claim 6, wherein the monitoring part includes a watchdog timer configured to detect a frequency abnormality of a monitoring target signal.

8. An electronic device comprising a monitoring device, wherein the monitoring device comprises:
a monitoring part configured to detect an abnormality of a monitoring target, and including a first monitoring mechanism configured to detect whether or not an input signal is higher than a first threshold value;
a self-diagnosis part configured to diagnose whether or not the first monitoring mechanism operates abnormally during a period from a startup time point of a power supply to an elapse time point at which a reset release waiting time elapses; and
a reset control part configured to release a reset of a reset output signal on or after the elapse time point, wherein the self-diagnosis part is further configured to, while the input signal is switched between a first test signal and a second test signal, determine whether or not an output signal of the first monitoring mechanism matches a value that is predetermined according to the input signal, and wherein the first test signal is pre-set to be higher than the first threshold value and the second test signal is pre-set to be lower than the first threshold value.

9. A motor vehicle comprising an electronic device comprising a monitoring device, wherein the monitoring device comprises:

a monitoring part configured to detect an abnormality of a monitoring target, and including a first monitoring mechanism configured to detect whether or not an input signal is higher than a first threshold value;

a self-diagnosis part configured to diagnose whether or not the first monitoring mechanism operates abnormally during a period from a startup time point of a power supply to an elapse time point at which a reset release waiting time elapses; and a reset control part configured to release a reset of a reset output signal on or after the elapse time point, wherein the self-diagnosis part is further configured to, while the input signal is switched between a first test signal and a second test signal, determine whether or not an output signal of the first monitoring mechanism matches a value that is predetermined according to the input signal, and wherein the first test signal is pre-set to be higher than the first threshold value and the second test signal is pre-set to be lower than the first threshold value.

* * * * *